(12) United States Patent
Vatidis et al.

(10) Patent No.: US 11,928,395 B1
(45) Date of Patent: Mar. 12, 2024

(54) FLOORPLAN DRAWING CONVERSION AND ANALYSIS FOR SPACE MANAGEMENT

(71) Applicant: Hubstar International Limited, London (GB)

(72) Inventors: Stefanos Vatidis, London (GB); Denis Mequinion, London (GB)

(73) Assignee: Hubstar International Limited, London (GB)

( * ) Notice: Subject to any disclaimer, the term of this patent is extended or adjusted under 35 U.S.C. 154(b) by 0 days.

(21) Appl. No.: 18/300,822

(22) Filed: Apr. 14, 2023

(51) Int. Cl.
*G06F 18/2413* (2023.01)
*G06F 30/13* (2020.01)
(Continued)

(52) U.S. Cl.
CPC .......... *G06F 30/13* (2020.01); *G06F 18/2413* (2023.01); *G06T 7/11* (2017.01);
(Continued)

(58) Field of Classification Search
CPC ........ G06F 18/2413; G06F 30/13; G06T 7/11; G06T 7/13; G06T 2200/24; G06T 2207/20021; G06T 2207/20081
See application file for complete search history.

(56) References Cited

U.S. PATENT DOCUMENTS

| | | | |
|---|---|---|---|
| 11,089,666 B1 * | 8/2021 | Dableh | H05B 47/13 |
| 2013/0226451 A1 * | 8/2013 | O'Neill | H04W 4/027 701/450 |

(Continued)

FOREIGN PATENT DOCUMENTS

| | | | | |
|---|---|---|---|---|
| CN | 111241993 A | * | 6/2020 | G06K 9/00771 |
| CN | 112287433 A | * | 1/2021 | |

(Continued)

OTHER PUBLICATIONS

Yin et al., ("Generating 3D Building Models from Architectural Drawings: A Survey," IEEE Computer Graphics and Applications; Date of Publication: Dec. 30, 2008) (Year: 2008).*

(Continued)

*Primary Examiner* — Yubin Hung
(74) *Attorney, Agent, or Firm* — Dority & Manning, P.A.

(57) ABSTRACT

The data representing the floor plan is processed to classify the different elements in the floor plan. This step may be carried out by processing, using at least one image classification model, different images representing different layers of the floor plan data to identify the type of elements belonging to each layer. A group of elements belonging to a subset of the classifications are then selected and used to segment the floor plan into different spaces. For example, certain boundary elements (e.g. the walls and doors) between different spaces (i.e. rooms) in the floor plan may be identified and selected. Once identified, the boundary elements may be used to segment the floor plan into different spaces, which can then be analysed to determine the characteristics of those spaces, in particular the classification of the space into a type (e.g. an intended use for the space or a type of space, such as an, office, meeting room, kitchen, etc). To perform the classification of the spaces, image data for each space is provided to one or more image classification models, to obtain an indication of the classification. Further analysis can be performed on the identified spaces to determine capacity within each space, size (area) occupied by each space, and number of entry/exit points.

29 Claims, 17 Drawing Sheets

(51) Int. Cl.
*G06T 7/11* (2017.01)
*G06T 7/13* (2017.01)

(52) U.S. Cl.
CPC ............ *G06T 7/13* (2017.01); *G06T 2200/24* (2013.01); *G06T 2207/20021* (2013.01); *G06T 2207/20081* (2013.01)

(56) References Cited

U.S. PATENT DOCUMENTS

| | | | | |
|---|---|---|---|---|
| 2015/0153180 | A1* | 6/2015 | Ettinger | G01C 21/206 701/410 |
| 2015/0177948 | A1* | 6/2015 | Sasaki | G06F 3/04817 715/740 |
| 2019/0072395 | A1* | 3/2019 | Namboodiri | G06F 30/18 |
| 2019/0130233 | A1* | 5/2019 | Stenger | G06V 30/274 |
| 2019/0332114 | A1* | 10/2019 | Moroniti | G05D 1/0214 |
| 2019/0347367 | A1* | 11/2019 | Livnat | G06F 16/909 |
| 2022/0051459 | A1* | 2/2022 | Brenner | G06V 20/64 |
| 2022/0074762 | A1* | 3/2022 | Artes | G01C 21/3859 |
| 2022/0148327 | A1* | 5/2022 | Fu | G06V 10/25 |
| 2023/0222829 | A1* | 7/2023 | Yun | G06T 7/73 382/156 |

FOREIGN PATENT DOCUMENTS

| | | | | |
|---|---|---|---|---|
| CN | 113947450 | A | * | 1/2022 |
| CN | 115375873 | A | * | 11/2022 |
| JP | 6116746 | B1 | * | 4/2017 ............ G06F 30/00 |
| WO | WO-2018005933 | A1 | * | 1/2018 ........... A01K 27/001 |
| WO | WO-2022194674 | A1 | * | 9/2022 |

OTHER PUBLICATIONS

Dodge et al. ("Parsing floor plan images," 15th IAPR International Conference on Machine Vision Applications; Date of Conference: May 8-12, 2017) (Year: 2017).*

Gimenez et al. ("Review: reconstruction of 3d building information models from 2d scanned plans," Journal of Building Engineering, vol. 2, Jun. 2015) (Year: 2015).*

Heras et al. ("Wall Patch-Based Segmentation in Architectural Floorplans," International Conference on Document Analysis and Recognition; Date of Conference: Sep. 18-21, 2011) (Year: 2011).*

Domínguez et al. ("Semiautomatic detection of floor topology from CAD architectural drawings," Computer-Aided Design, vol. 44, Iss. 5, May 2012) (Year: 2012).*

Paudel et al. ("Room Classification on Floor Plan Graphs using Graph Neural Networks," arXiv:2108.05947; Aug. 12, 2021) (Year: 2021).*

Aoki et al. ("A prototype system for interpreting hand-sketched floor plans," Proceedings of 13th International Conference on Pattern Recognition; Date of Conference: Aug. 25-29, 1996) (Year: 1996).*

Ahmed et al. ("Improved Automatic Analysis of Architectural Floor Plans," International Conference on Document Analysis and Recognition; Date of Conference: Sep. 18-21, 2011) (Year: 2011).*

* cited by examiner

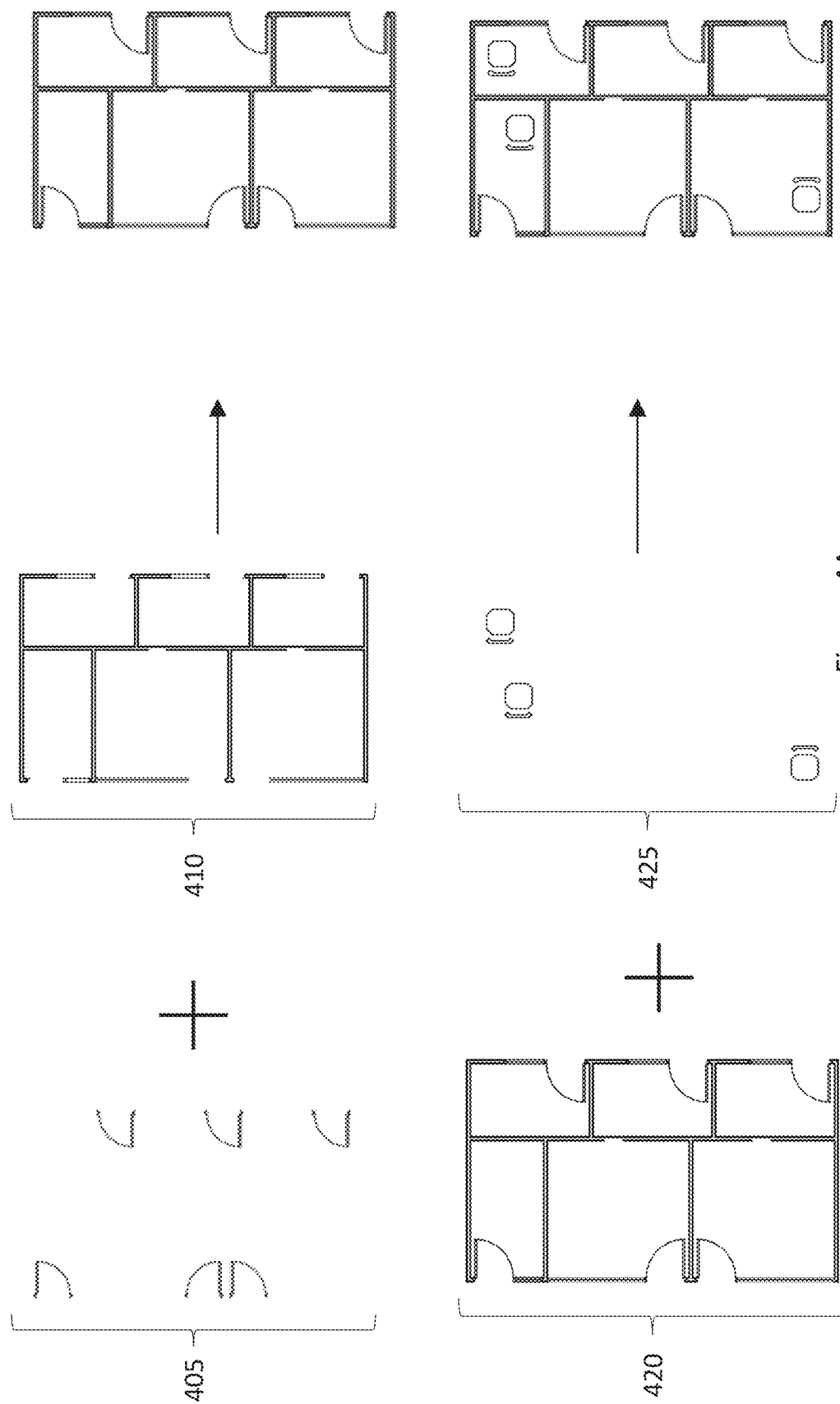

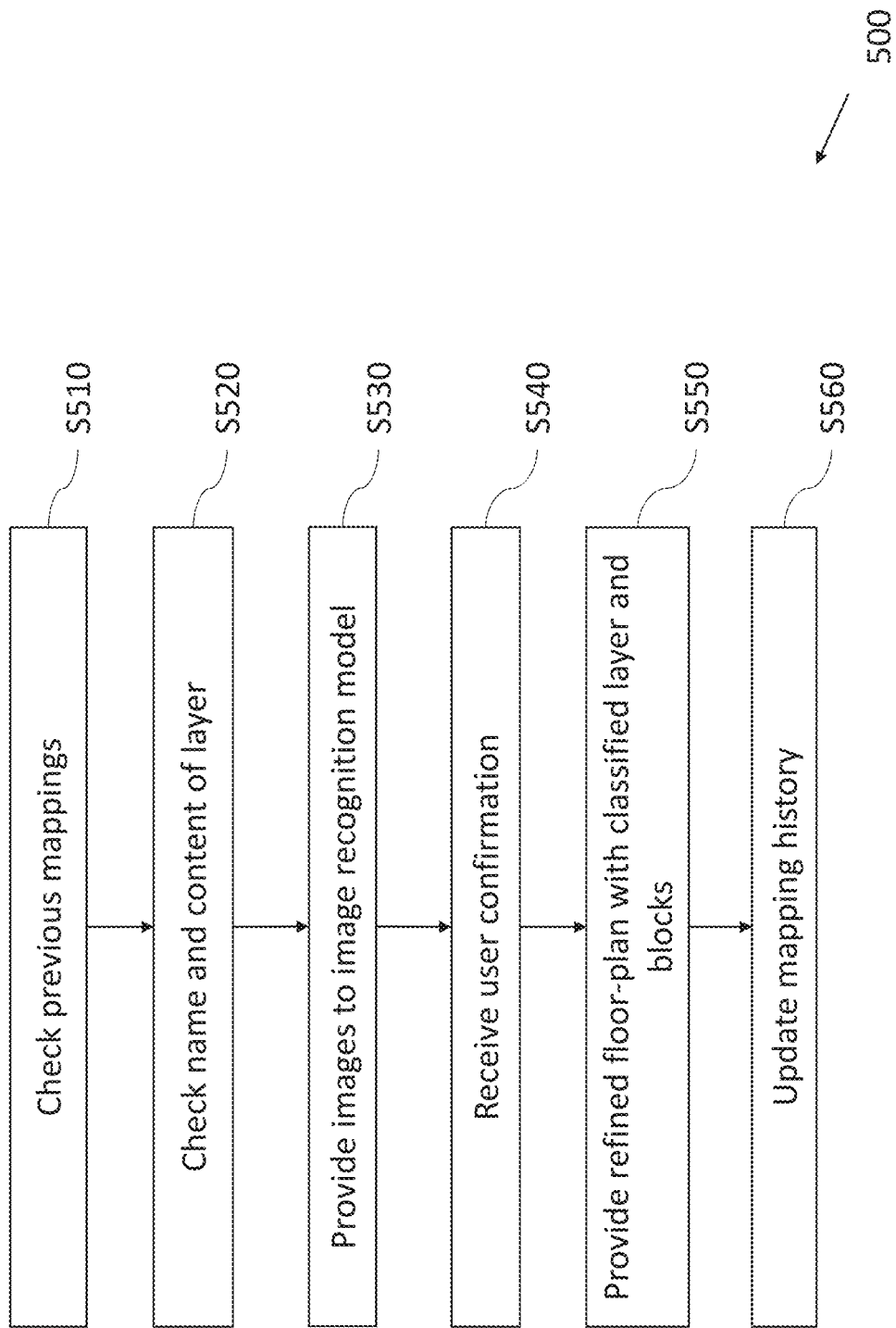

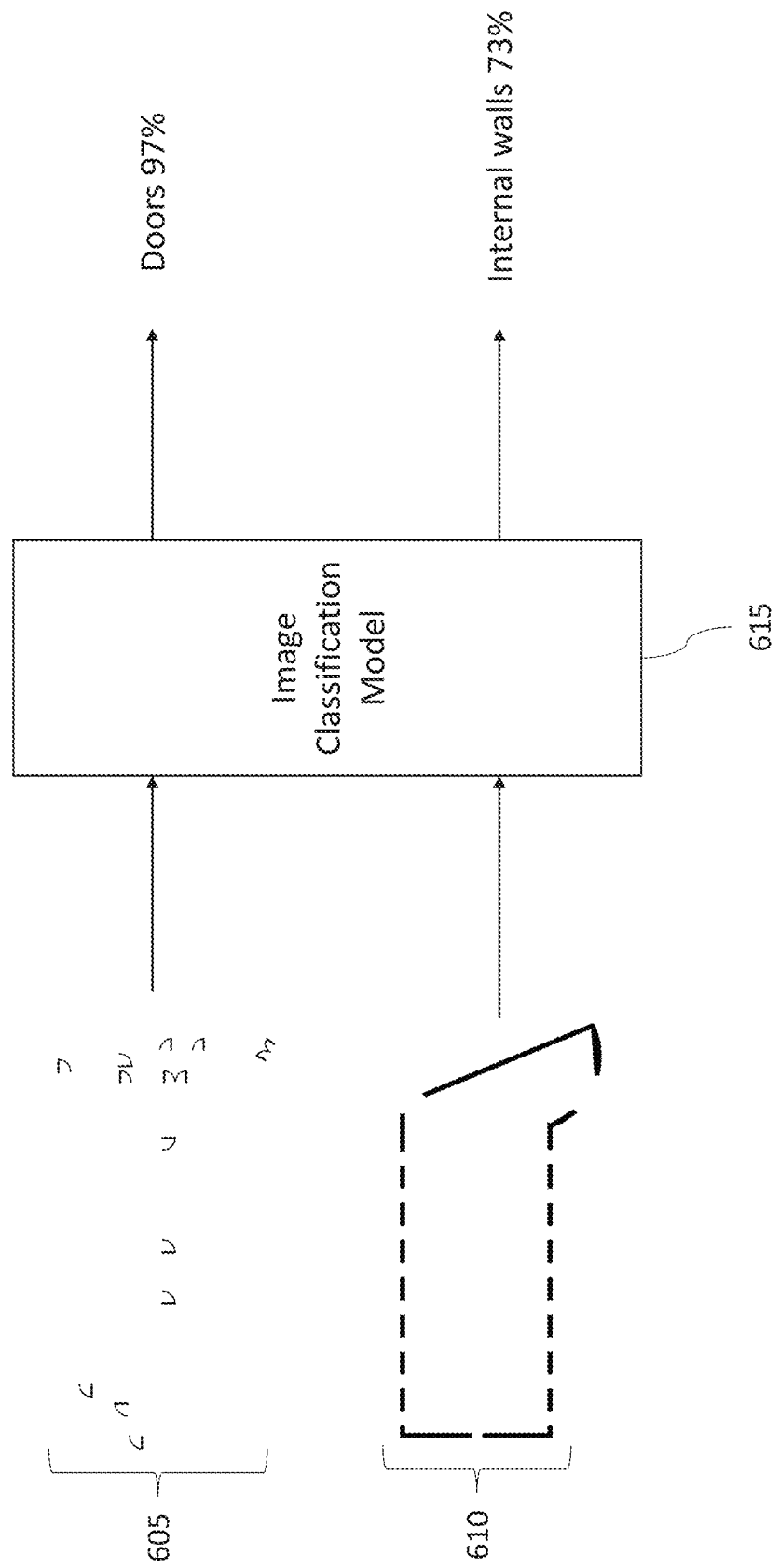

US 11,928,395 B1

FLOORPLAN DRAWING CONVERSION AND ANALYSIS FOR SPACE MANAGEMENT

TECHNICAL FIELD

The present disclosure relates to a computer system comprising at least one processor and at least one memory, and in particular to a computer system for analysing data representing a floor plan to obtain one or more classifications of one or more spaces within the floor plan.

BACKGROUND

Providing data indicating the layout and function of different spaces in a building has important applications for performing management of such spaces. Having access to attribute data associated with these different spaces is useful for controlling and managing the different spaces within a building. For example, in a workplace, such information is useful for undertaking capacity planning, personnel assignment, health and safety analysis, space and resource scheduling, utilization measurement, inventory, or asset maintenance, and more. Specially designed space management software is used for at least some of these purposes and enables a user to achieve the required ends in a time efficient manner.

One of the challenges associated with providing for management of space is the requirement to generate suitable attribute data from the raw floor plan data that is available. The source of such raw floor plan data is typically in the form of CAD (computer aided design) documents. Enterprises can hold a significant volume of CAD documents to represent the floor plans of their real estate portfolio. These come in a variety of shapes, file formats and data quality depending on age, originating architect or system. In some cases, there might not be a CAD file available for some of the floor plans, but only images or alternate formats (JPEG, pdf, SVG) representing the floor plan. When attempting to perform centralized management of these floor plans in a computerized space management system, a vast amount of time can be spent in cleaning, enriching and manually categorizing the elements and rooms that are present in these floor plans.

SUMMARY

It is desirable to provide a system and method for determining the required attribute data associated with different spaces (i.e. rooms) in a floor plan.

According to an aspect, there is provided a computer system comprising at least one processor and at least one memory comprising computer readable instructions, the at least one processor being configured to execute the instructions to perform the steps of: for each of a plurality of elements in a floor plan, determining from data representing the floor plan, one of a number of classifications for the respective element; selecting a group of the elements in response to determining that the group of the elements belong to one or more predetermined ones of the classifications; based on a group of the elements segmenting the floor plan into a number of different spaces; and for each of at least some of the different spaces, providing image data representing the respective space as an input to an image classification model to obtain a classification for the respective space.

The data representing the floor plan is processed to classify the different elements in the floor plan. This step may be carried out by processing, using at least one image classification model, different images representing different layers of the floor plan data to identify the type of elements belonging to each layer. A group of elements belonging to a subset of the classifications are then selected and used to segment the floor plan into different spaces. For example, certain boundary elements (e.g. the walls and doors) between different spaces (i.e. rooms) in the floor plan may be identified and selected. Once identified, the boundary elements may be used to segment the floor plan into different spaces, which can then be analysed to determine the characteristics of those spaces, in particular the classification of the space into a type (e.g. an intended use for the space or a type of space, such as an, office, meeting room, kitchen, etc). To perform the classification of the spaces, image data for each space is provided to one or more image classification models, to obtain an indication of the classification. Further analysis can be performed on the identified spaces to determine capacity within each space, size (area) occupied by each space, and number of entry/exit points.

In some embodiments, for each of the at least some of the different spaces, the image classification model comprises a machine learning model configured to process the image data representing the respective space to obtain the classification for the respective space.

In some embodiments, the one or more predetermined ones of the classifications comprises one or more types of element representing boundaries between the different spaces, wherein the group of the elements comprises the elements representing the boundaries between the different spaces in the floor plan.

In some embodiments, the elements representing the boundaries between the number of different spaces comprise wall elements.

In some embodiments, the elements representing the boundaries between the number of different spaces further comprise door elements.

In some embodiments, the step of segmenting the floor plan into a number of different spaces comprises, for each of the different spaces: determining a point falling within an enclosed spaces formed by ones of the boundaries associated with the respective space; and starting from the respective point, tracing a path along the ones of the boundaries associated with the respective space.

In some embodiments, the step of segmenting the floor plan into a number of different spaces comprises, for each of the different spaces: determining a point falling within an enclosed space formed by ones of the boundaries associated with the respective space; and recursively exploring the respective space starting from the respective point until reaching the ones of the boundaries associated with the respective space.

In some embodiments, the step of determining for each of the plurality of elements in a floor plan, the respective one of the number of classifications, comprises applying the data representing the floor plan to one or more further image classification models operable to classify the elements.

In some embodiments, the data representing the floor plan comprises multiple layers, each of which comprises one or more elements, wherein the determining the classifications for each of the elements comprises: for each of the layers, providing an image representing the respective layer to one or more further image classification models to determine, a respective classification for the elements of that layer.

In some embodiments, at least one of the multiple layers comprises elements belonging to different classifications, wherein the at least one processor is configured to execute the instructions to perform the steps of: updating the data representing a floor plan to split the elements belonging to different classifications between different layers.

In some embodiments, for at least one of the multiple layers, a respective classification for the elements of that layer is a seating type; and the steps further comprise determining seating capacity of at least one of the spaces of the floor plan by counting a number of elements within the at least one of the multiple layers.

In some embodiments, the determining the classification for at least some of the elements is performed in dependence upon a name of a layer derived from a source file comprising the floor plan.

In some embodiments, the one or more predetermined ones of the classifications comprises one or more types of element representing objects within the spaces, wherein the step of, based on the group of the elements, segmenting the floor plan into a number of different spaces comprises identifying a number of clusters within the group of the elements in the floor plan.

In some embodiments, the at least one processor is configured to execute the instructions to perform the steps of: deriving the data representing a floor plan from a source file providing according to a first format.

In some embodiments, the first format is a computer aided design format.

In some embodiments, for at least some of the elements, the determining the respective classification is performed in dependence upon information determined for an earlier version of the source file.

In some embodiments, the at least one processor is configured to execute the instructions to: derive further data representing a further floor plan from a further source file, the further source file being provided according to a second format; and the data representing the floor plan and the further data representing the further floor plan are each provided according to a standard representation.

In some embodiments, the at least one processor is configured to execute the instructions to perform the steps of, for each of the different spaces: deriving from the image classification model, a prediction of the classification for the respective space; and determining the classification for the respective space in dependence upon user input confirming the prediction.

In some embodiments, the image classification model is a machine learning model, wherein the at least one processor is configured to execute the instructions to perform the steps of: providing training data comprising: the image data; and a set of labels for the image data derived from the user input; and performing one or more training iterations based on the training data to update the machine learning model to improve the accuracy of classifications produced by the machine learning model.

In some embodiments, the at least one processor is configured to execute the instructions to perform one or both of the following steps: for each of one or more of the different spaces, determining an area of the respective space in the floor plan based on a size of those spaces in the floor plan; and for each of one or more of the different classifications, determining an area of any spaces classified according to the classification in the floor plan based on the size of those spaces in the floor plan.

In some embodiments, wherein the at least one processor is configured to execute the instructions to: provide a space management application, including controlling an interface of the computer system to display the determined classifications for each of at least some of the different spaces.

In some embodiments, the at least one processor is configured to execute the instructions to, for at least one of the spaces: in dependence upon the determined classification for the respective space, output a control signal to control one or more of: a temperature of the space; a lighting level within the space; a timing of activation of lighting within the space; and a fire system within the space.

In some embodiments, the step of extracting from the floor plan based on the identified boundaries, image data representing each of the number of different spaces comprises: increasing the thickness of the identified boundaries; identifying each of the number of different spaces by: placing a respective reference point within each enclosed space in the floor plan; and exploring the enclosed space starting from the reference point.

According to a second aspect, there is provided a computer implemented method for classifying a number of different spaces of a floor plan, the method comprising: for each of a plurality of elements in the floor plan, determining from data representing the floor plan, one of a number of classifications for the respective element; selecting a group of the elements in response to determining that the group of the elements belong to one or more predetermined ones of the classifications; based on the selected group of the elements, segmenting the floor plan into a number of different spaces; and for each of at least some of the different spaces, providing image data representing the respective space as an input to an image classification model to obtain a classification for the respective space.

In some embodiments, for each of the at least some of the different spaces, the image classification model comprises a machine learning model, the method comprising processing the image data representing the respective space to obtain the classification for the respective space.

In some embodiments, the one or more predetermined ones of the classifications comprises one or more types of element representing boundaries between the different spaces, wherein the group of the elements comprises the elements representing the boundaries between the different spaces in the floor plan.

In some embodiments, the elements representing the boundaries between the number of different spaces comprise wall elements.

In some embodiments, the elements representing the boundaries between the number of different spaces further comprise door elements.

In some embodiments, the step of segmenting the floor plan into a number of different spaces comprises, for each of the different spaces: determining a point falling within an enclosed spaces formed by ones of the boundaries associated with the respective space; and starting from the respective point, tracing a path along the ones of the boundaries associated with the respective space.

In some embodiments, the step of segmenting the floor plan into a number of different spaces comprises, for each of the different spaces: determining a point falling within an enclosed space formed by ones of the boundaries associated with the respective space; and recursively exploring the respective space starting from the respective point until reaching the ones of the boundaries associated with the respective space.

In some embodiments, the step of determining for each of the plurality of elements in a floor plan, the respective one of the number of classifications, comprises applying the data representing the floor plan to one or more further image classification models operable to classify the elements.

In some embodiments, the data representing the floor plan comprises multiple layers, each of which comprises one or more elements, wherein the determining the classifications for each of the elements comprises: for each of the layers, providing an image representing the respective layer to one or more further image classification models to determine, a respective classification for the elements of that layer.

In some embodiments, at least one of the multiple layers comprises elements belonging to different classifications, wherein the method comprises updating the data representing a floor plan to split the elements belonging to different classifications between different layers.

In some embodiments, for at least one of the multiple layers, a respective classification for the elements of that layer is a seating type; and the method comprises determining seating capacity of at least one of the spaces of the floor plan by counting a number of elements within the at least one of the multiple layers.

In some embodiments, the determining the classification for at least some of the elements is performed in dependence upon a name of a layer derived from a source file comprising the floor plan.

In some embodiments, the one or more predetermined ones of the classifications comprises one or more types of element representing objects within the spaces, wherein the step of, based on the group of the elements, segmenting the floor plan into a number of different spaces comprises identifying a number of clusters within the group of the elements in the floor plan.

In some embodiments, the method comprises deriving the data representing a floor plan from a source file providing according to a first format.

In some embodiments, the first format is a computer aided design format.

In some embodiments, for at least some of the elements, the determining the respective classification is performed in dependence upon information determined for an earlier version of the source file.

In some embodiments, the method comprises deriving further data representing a further floor plan from a further source file, the further source file being provided according to a second format; and the data representing the floor plan and the further data representing the further floor plan are each provided according to a standard representation.

In some embodiments, the method comprises, for each of the different spaces: deriving from the image classification model, a prediction of the classification for the respective space; and determining the classification for the respective space in dependence upon user input confirming the prediction.

In some embodiments, the image classification model is a machine learning model, wherein the method comprises providing training data comprising: the image data; and a set of labels for the image data derived from the user input; and performing one or more training iterations based on the training data to update the machine learning model to improve the accuracy of classifications produced by the machine learning model.

In some embodiments, the method comprises one or both of the following steps: for each of one or more of the different spaces, determining an area of the respective space in the floor plan based on a size of those spaces in the floor plan; and for each of one or more of the different classifications, determining an area of any spaces classified according to the classification in the floor plan based on the size of those spaces in the floor plan.

In some embodiments, wherein the method comprises providing a space management application, including controlling an interface of the computer system to display the determined classifications for each of at least some of the different spaces.

In some embodiments, the method comprises, for at least one of the spaces: in dependence upon the determined classification for the respective space, outputting a control signal to control one or more of: a temperature of the space; a lighting level within the space; a timing of activation of lighting within the space; and a fire system within the space.

In some embodiments, the step of extracting from the floor plan based on the identified boundaries, image data representing each of the number of different spaces comprises: increasing the thickness of the identified boundaries; identifying each of the number of different spaces by: placing a respective reference point within each enclosed space in the floor plan; and exploring the enclosed space starting from the reference point.

In some embodiments, for each of the at least some of the different spaces, the respective image data comprise vector data.

In some embodiments, for a first of the different spaces, the at least one processor is configured to execute the instructions to perform the steps of: identifying a plurality of regions within the first of the different spaces by identifying a number of sets within the first of the different spaces, each of the sets comprising elements of a predefined type.

In some embodiments, the at least some of the different spaces comprise one or more of: a meeting room; an office; a reception area; a bathroom; a kitchen; a circulation area; a workspace; and a navigable space.

In some embodiments, a first of the at least some of the different spaces comprises a navigable space, wherein the at least one processor is configured to execute the instructions to perform the steps of: determining a path difference between two different points within the navigable space.

According to a third aspect, there is provided a computer program comprising computer readable instructions which, when executed by at least one processor causes a method according to any embodiment of the second aspect to be performed.

According to a fourth aspect, there is provided a non-transitory computer readable medium storing the computer which, when executed by at least one processor causes a method according to any embodiment of the third aspect to be performed.

BRIEF DESCRIPTION OF DRAWINGS

Arrangements of the present invention will be understood and appreciated more fully from the following detailed description, made by way of example only and taken in conjunction with drawings in which:

FIG. 4A illustrates examples of different layers of a floor plan that may be derived from a source file;

FIG. 5 illustrates an example of a process for classifying a layer within a set of data representing a floor plan;

FIG. 6 illustrates an example of the use of an image classification model to perform identification of a doors layer and an internal walls layer;

DETAILED DESCRIPTION

Figure 1:
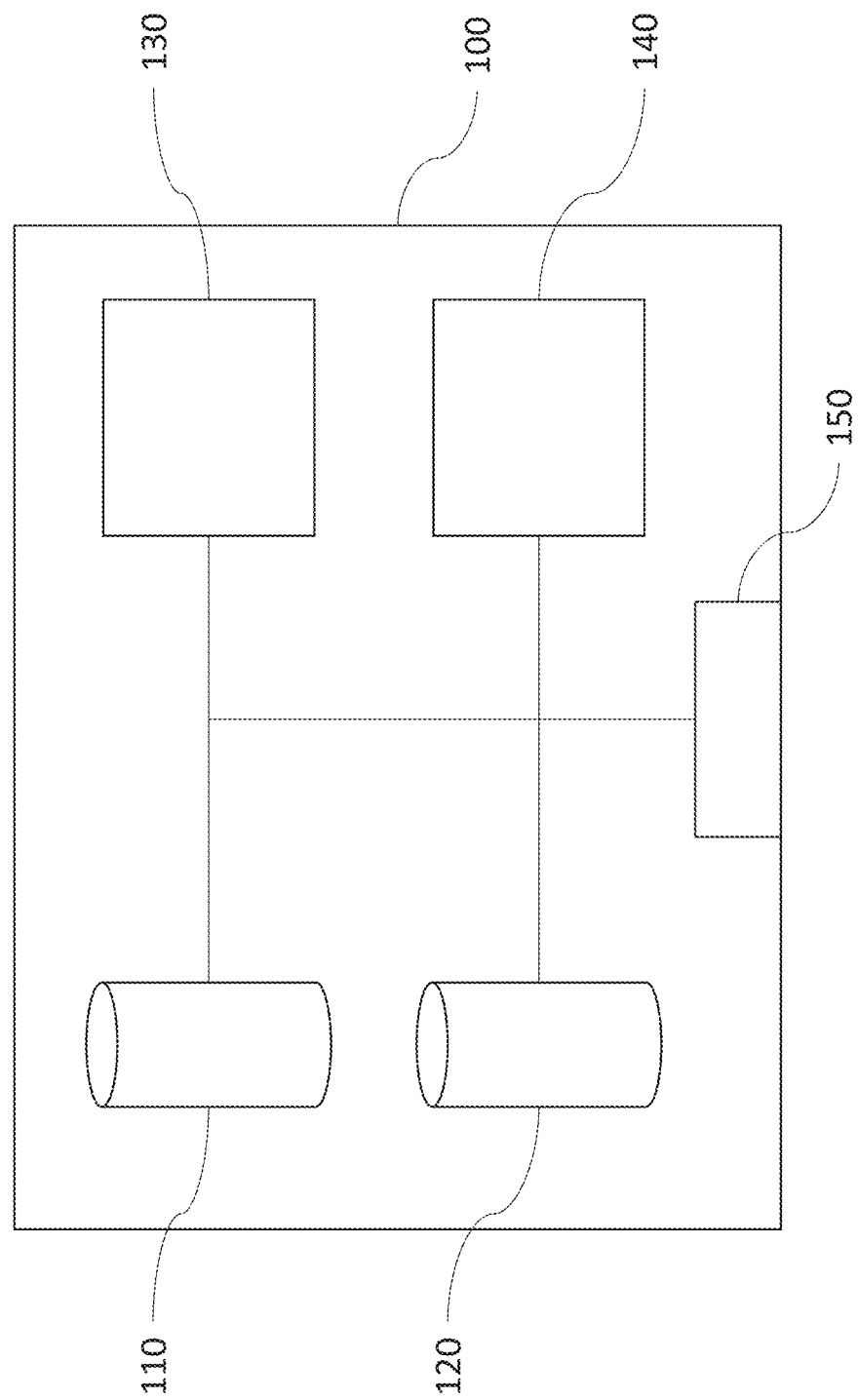
FIG. 1 shows an example computer system in which embodiments may be implemented.

Embodiments of the application relate to use of one or more machine learning models for providing classification of spaces in a floor plan. Such machine learning models may run on a computing system, which comprises at least one processor and at least one memory. Reference is made to FIG. 1, which illustrates a computer system 100, which takes the form of a user device 100. The device 100 may be a mobile user equipment (UE), a personal computer (PC), a terminal or workstation, a server, or some other form of device.

The system 100 comprises an interface 140 over which it sends and receive signals. The interface 140 may be a wired or wireless interface. For instance, the interface 140 may comprise a wired interface for connection to a wired network (e.g. a local area network and/or the internet). Alternatively or in addition, the interface 140 may comprise transceiver apparatus configured to send and receive communications over a radio interface. The transceiver apparatus may be provided, for example, by means of a radio part and associated antenna arrangement. The antenna arrangement may be arranged internally or externally to the system 100.

The system 100 is provided with at least one data processing entity 115, at least one random access memory 120, at least one read only memory 125, and other possible components 130 for use in software and hardware aided execution of tasks it is designed to perform, including control of, access to, and communications with access systems and other communication devices. The at least one random access memory 120 and the hard drive 125 are in communication with the data processing entity 115, which may be a data processor. The data processing, storage and other relevant control apparatus can be provided on an appropriate circuit board and/or in chipsets. A user controls the operation of the system 100 by means of a suitable user interface such as key pad 110, or by voice commands. A display 105 is included on the system 100 for displaying visual content to a user. The system 100 may also comprise a speaker for providing audio content.

The memory of the system 100 (i.e. the random access memory 120 and the hard drive 125) is configured to store computer readable instructions for execution by the data processor 115 to perform the data processing functions described herein as being performed by the system 100.

Figure 2:
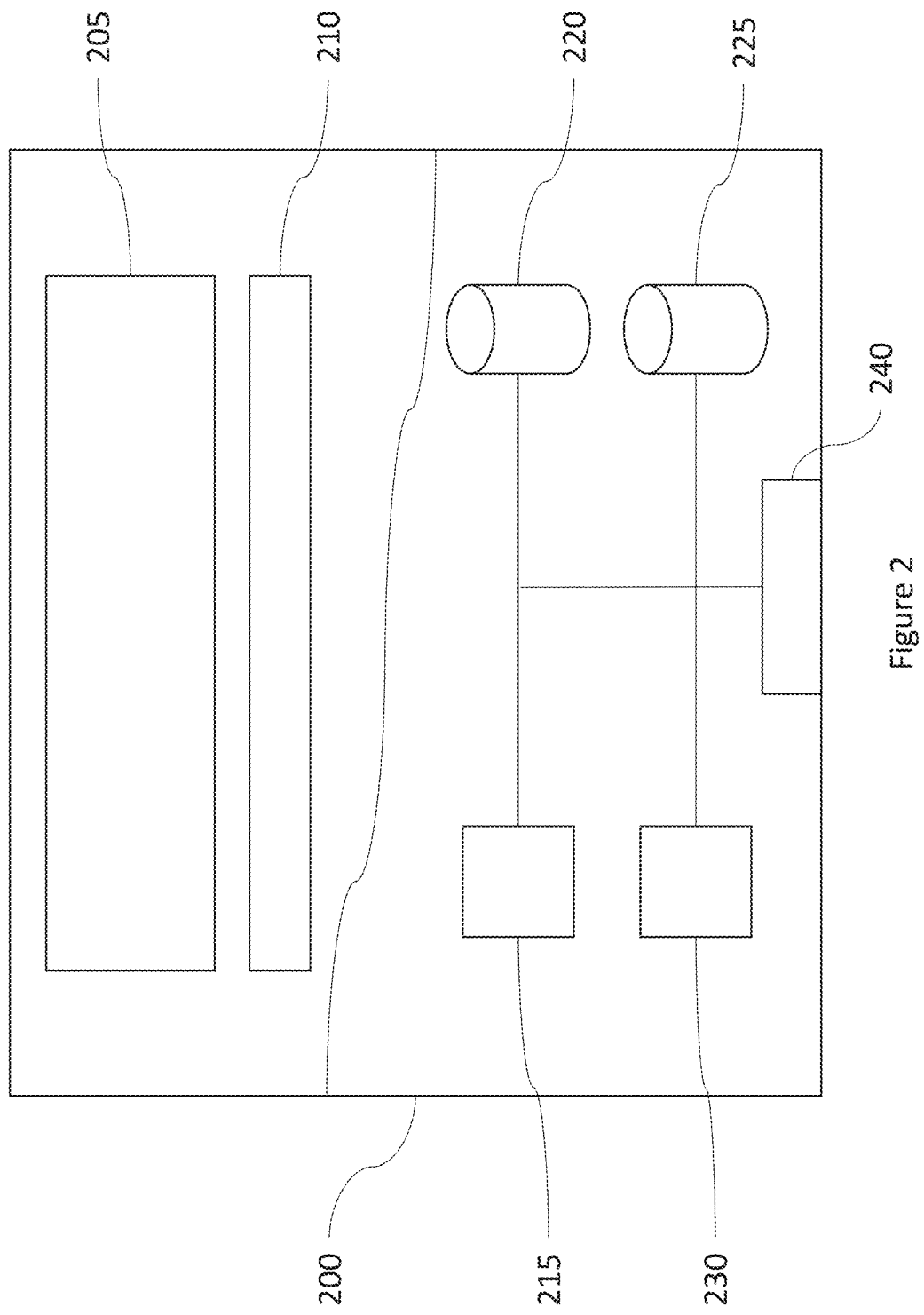
FIG. 2 shows a further example computer system in which embodiments may be implemented.

The image classification models may be machine learning models trained either by the system 100 of FIG. 1 or by a separate computer system. Reference is made to FIG. 2, which illustrates an example computer system 200 that may be used for performing the training of machine learning models. The system 200 is shown as a single enclosed apparatus. However, in some embodiments, the system 200 is a distributed system, with multiple data processing apparatuses operating in communication with one other. The system 200 may comprise a server, back-end system, or the like.

The system 200 comprises at least one random access memory 210, at least one hard drive 220, at least one data processing unit 230, 240 and an input/output interface 250. The memories 210, 220, store data for inputting to the one or more models and for storing results of the processing performed during execution of the one or more models. The memories 210, 220 store the training data, which is applied to train the machine learning models. The memories 210, 220 additionally store computer executable code which, when executed by at least one data processing unit 230, 240, provide the one or more machine learning models. At least one of the data processing units 230, 240 performs one or more of: the processing associated with the one or more models, the training of the models, and any necessary pre-processing of data for use by the models. Via the interface 250, the system 200 receives the data items for constructing the training data sets and/or the data items for constructing the operating data sets. The system 200 additionally sends via the interface 250, the results produced by running the models on input data.

Although the two systems 100, 200 are each referred to as separate systems, they may each be considered to be separate devices of a single computer system.

Figure 3:
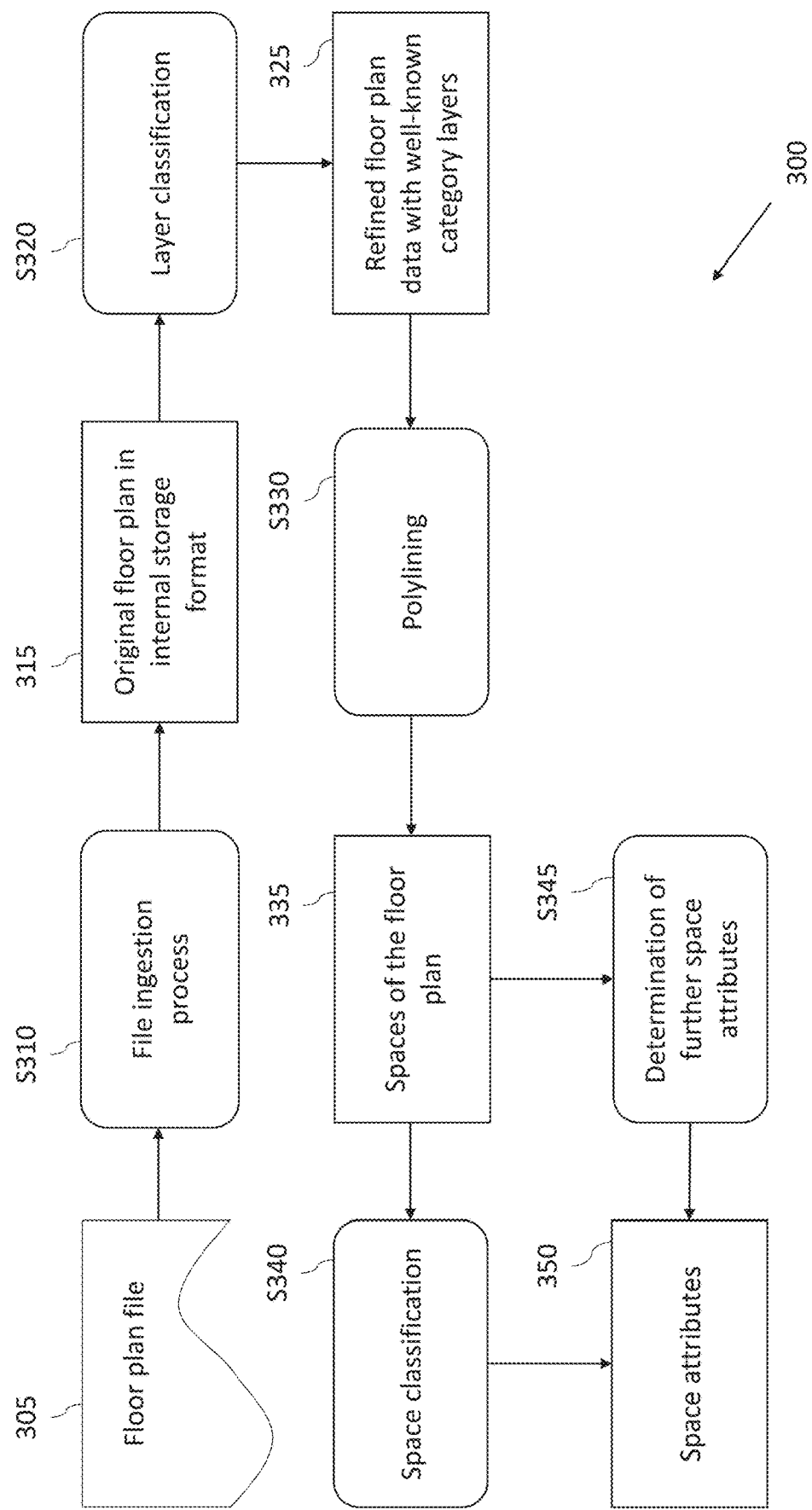
FIG. 3 shows the steps of a process for analyzing floor plan files.

Reference is made to FIG. 3, which illustrates a process 300 for analyzing files containing floor plans to classify the layers and objects in the floor plans, and to determine attributes associated with the spaces within these floor plans. The objects in the floor plans may also be referred to as elements or blocks. The steps of the process 300 may be performed by the system 100.

The floor plan 305 is subject to a file ingestion process S310. The floor plan file 305 may be a CAD document. The floor plan file 305 may be provided in a variety of possible file formats, including AutoCAD DWG, AutoCAD DXF, Scalable Vector Graphics (SVG), PDF or plain images. The system 100 is operable to perform the process 300 with respect to floor plan files belonging to multiple different formats.

At S310, the floor plan file 305 is subject to a file ingestion process S310 in which the raw data from the floor plan file is converted to a representation suitable for processing by the remaining stages of the process 300. The output of S310 depends on the file format in which the floor plan file 305 is provided, but comprises at least one of raster image data or vector data. If the floor plan file 305 is a plain image file, the output of process S310 is raw image data representing the floor plan in the file. If the floor plan file 305 is a CAD file, the output of process S310 is image data and vector data representing the floor plan. If the floor plan file 305 is a PDF file, the output of process S310 is image data and vector data. If the floor plan file 305 is an SVG file, the output of process S310 is vector data representing the floor plan.

A floor plan file 305 may comprise shaded or colour coded elements, where the shade or colour is used to distinguish between different types of element. For example, internal walls may be provided according to a first colour, whilst external walls are provided according to a second colour. Similarly, the floor plan file 305 may comprise elements that are represented according to different level of grey in a greyscale image (e.g. a different level of shading), where the level of grey is used to distinguish between different types of elements. For example, internal walls may be provided according to a first level of grey, whilst external walls are provided according to a second level of grey. If the floor plan file 305 comprises image data that comprises elements in different colours, the process S310 may separate elements that are provided according to different colours into different layers. Similarly, if the floor plan file 305 comprises image data that comprises elements in different level of grey, the process S310 may separate elements that are provided according to different levels of grey into different layers.

The output of process S310 is the floor plan 315 in a format—which may be referred to as the internal storage format—comprising the image data and/or structured vector data that represents the floor plan. This data representing the floor plan 315 is in a number of different layers, where each layer comprises one or more types of element (e.g. walls, doors, furniture, plumbing, HVAC, electric, heating, space names (text), space dimensions (text)) associated with that layer. The division of elements between the different layers is also part of the content of the original floor plan file 305.

Reference is made to FIG. 4A, which illustrates examples of different layers that may be present in the floor plan data 315. A first layer 405 may be part of the data 315. The first layer 405 is a doors layer comprising the doors that belong to the floor plan. A second layer 410 may also be part of the data 315. The second layer 410 is an internal walls layer comprising the internal walls belonging to the floor plan. The first and second layer 405, 410 may be presented (e.g. on the display 105 of the system 100) in combination with one another. The combination may represent the entire floor plan or may be combined with further layers (e.g. text and furniture) to represent a full view of the floor plan.

In some embodiments, the floor plan data 315 may comprise layers that mix different types of elements. As shown in FIG. 4A, a third example layer 420 comprises a mixture of doors and internal walls 410. FIG. 4 also shows how the third layer 420 may be viewed in combination with a fourth layer 425, which is a layer comprising chairs.

Figure 4B:
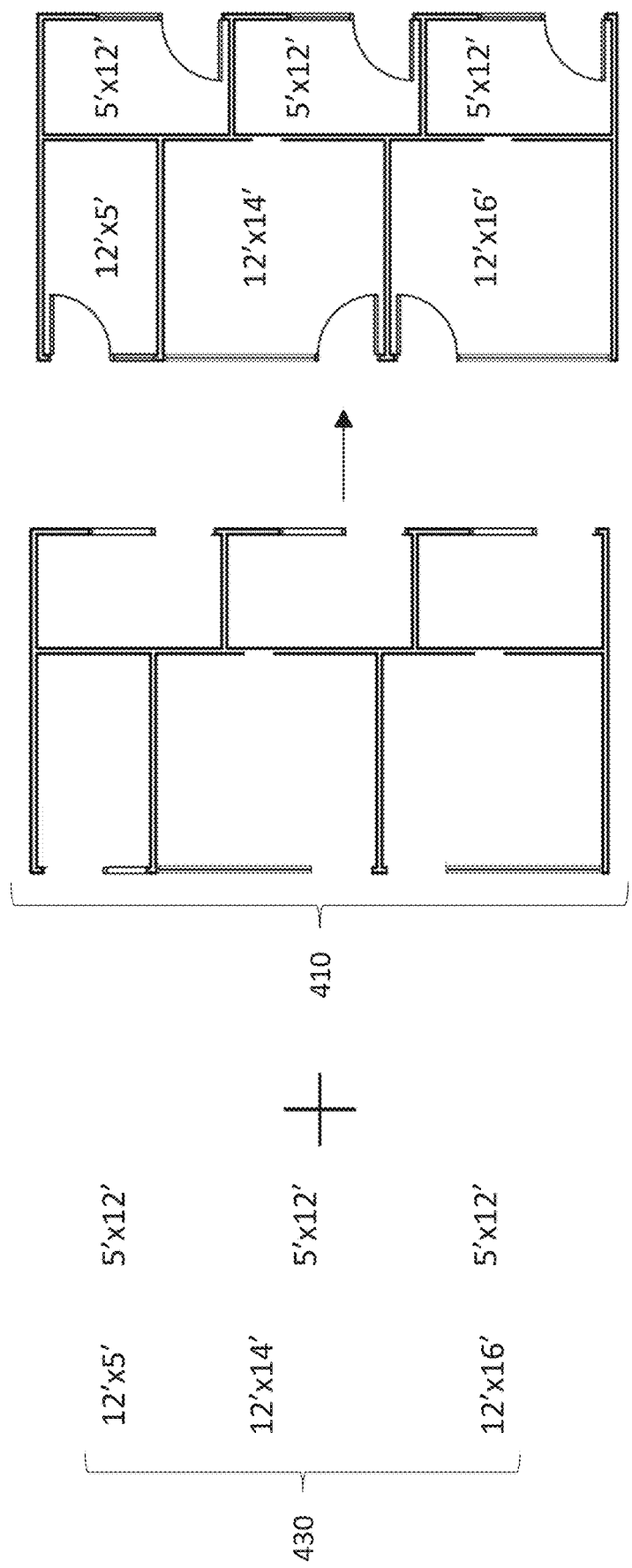
FIG. 4B illustrates further examples of different layers of a floor plan that may be derived from a source file.

FIG. 4B illustrates a further example, showing how a text layer 430 (which shows the dimensions of each of the spaces in the floor plan) may be viewed in combination with the first layer 410.

Referring again to FIG. 3, once the floor plan data 315 has been obtained, this data is then processed at S320 to provide classification of the different layers and elements in the floor plan. The classification of a particular layer may also be referred to as the 'type' or 'category' for that layer, and refers to the type of elements (e.g. external walls, furniture, doors) that are part of that layer.

Reference is made to FIG. 5, which illustrates a number of steps performed as part of the classification process at S320. The process 500 is performed for each of the different layers of the floor plan data 315.

At S510, the system 100 checks the previous mappings that may be used to inform a mapping of the current layer being processed. The previous mappings are stored in memory 120, 125 of the system 100 and are useful when multiple batches of files from similar sources are to be processed, as it can be expected that they will follow similar layer naming and attribution rules. One way in which this may be applied is if a layer being processed at S510 has the same name as a previous layer (derived from a previously processed floor plan file) mapped to a given category. In this case, the assumption may be made that the layer also maps to the same category. The system 100, in response to determining that the layer has the same name as a previously processed layer, determines that the layer belongs to the same category as the previous layer. For example, if a layer being processed at S510 is called "OOOEXTWLL" and a further layer of the same name was mapped to the external walls category, the system 100 may determine at S510 that the layer being processed also belongs to the external walls category with a very high degree of confidence.

Another way in which previous mappings may be made use of, is in the processing of layers derived from new versions of a file that was previously subject to the layer classification process. If the system 100 determines a match between the file name associated with a layer of floor plan data 315 being processed, and the file name of a previously processed layer, the system 100 then proceeds to check whether the layer being processed has been modified as compared to the previously processed layer. This check may be carried out by comparing the metadata of the two layers. The system 100 may store in memory 120, 125 previous mappings determined for layers that were previously classified, the floor plan file name associated with those layers, and additional metadata information (e.g. a time and date indicating when the layers were previously edited) that can be derived from the floor plan files. The system 100 compares the edit dates and times of the two layer and determines that no changes have been carried out if the edit dates and times are identical. In this case, the layer being processed is determined to be of the same type as the previously processed layer. Alternatively, the system 100 may check whether a layer has been modified by comparing the content of the two layers. For example, for each of the two layers, the image data representing the respective layer may be processed to generate a checksum value, with the system 100 then comparing the two checksum values to determine whether there are any differences in content between the two layers. In some cases, the system 100 may perform a direct comparison between the layer being processed and the previously processed layer to identify any elements which differ between the two layers. The system 100 then processes the new elements in the new layer to determine the classifications for those elements. If it is determined that the layer has not been modified, the system 110 determines at S510 that the layer belongs to the same category as the previously processed layer.

At S520, the system 100 checks the name and any content of the layer and determines whether the classification may be determined on the basis of this information. The floor plan data 315 may, for example, comprise name metadata associated with each of the layers, where that name metadata indicates the layer type. For example, the floor plan data 315 may comprise the name "FURNITURE" associated with a particular layer, in which case the system 100 classifies that layer as being a furniture layer. The analysis of layer names in the floor plan data may take account of specific meanings that apply to terms for a particular source of the floor plan data. For example, the memory 120, 125 of the system 100 may store an indication that the term "MOBEL" represents furniture elements for a certain set of floor plan files having a particular source. In this case, if the system 100 determines that the term "AIRVAC" appears in the name of a layer, the system 100 may categorize that layer as being a furniture layer.

A layer subject to analysis at S520 may be determined to contain only textual elements, in which case the layer belongs to one of the text layer types. By further examining the layer name or the format of the values therein, the system 100 may determine the precise textual classification. For example, if the text elements are of the shape "xxx.xx sqft" where xxx.xx represents a number, then the system 100 may determine that the layer is a surface area layer. As another example, if the system 100 determines the layer contains the words "Author", "Version" and a date, the system 100 may allocate the layer to the title category. As a further example of the analysis of the content of the layer, if the system 100 determines the layer contains only horizontal and vertical hashed lines, it may allocate the layer to the decorative grid layer.

At S530, the system 100 applies an image representing the layer as an input to a set of one or more image classification models. The set of one or more image classification models may comprise one model capable of performing the identification of multiple different types of layer. Alternatively, the set of one or more image classification models may comprise multiple different models, each of which is configured to identify a different type of layer. In either case, each of the one or more image classification models may be a trained machine learning model for identifying the type of layer. Alternatively, each of the one or more image classification models may be a different type of image classification model, e.g. based on programmed edge detection. The image classification model receives the image data representing the layer from the layer data 315. If the layer data 315 comprises vector data representing the layer, the system 100 converts this vector data into pixelated image data before applying the data as an input to the image classification model.

Reference is made to FIG. 6, which illustrates the use of an image classification model 615 for performing categorization of two layers 605, 610 as part of the layer classification process S320.

The two layers include a doors layer 605 and an internal walls layer 610. The system 100 provides the layer 605 to the model 615, and obtains from the model 615 an indication of the type of the layer 605 (in this case, an indication that the layer 605 is a doors layer). From the output of the model 615, the system 100 determines a given level of certainty (i.e. 97% in the example shown) associated with the determination that the layer 605 is a doors layer 605. The system 100 provides the layer 610 to the model 615, and obtains from the model 615, an indication that the layer 610 is an internal walls layer. From the output of the model 615, the system 100 determines a given level of certainty (i.e. 73% in the example shown) associated with the determination that the layer 610 is an internal walls layer 610. Accordingly, the image classification model outputs a level of certainty (e.g. a probability) that an input layer is of a particular classification type. The image classification model may output a probability for each classification type, and the system 100 may then determine the classification of the layer based on the probabilities (e.g. selecting the classification having the highest probability or selecting a classification that has a probability exceeding a corresponding threshold).

Some of the layers derived from the source file 305 may comprise elements belonging to different types. In this case, the system 100 may split the layers into sublayers, each of which only comprises elements of a particular type. The sublayers are then included in the refined floor plan 325 that is the output of the process 500. In order to split a layer from the data 315 into subtypes, an image classification model is used at S530 and is applied to different combinations of the elements in the layer. A sublayer to be output in the refined floor plan 325 comprises the combination of elements providing the best match to a particular type and having the most elements.

Figure 7:
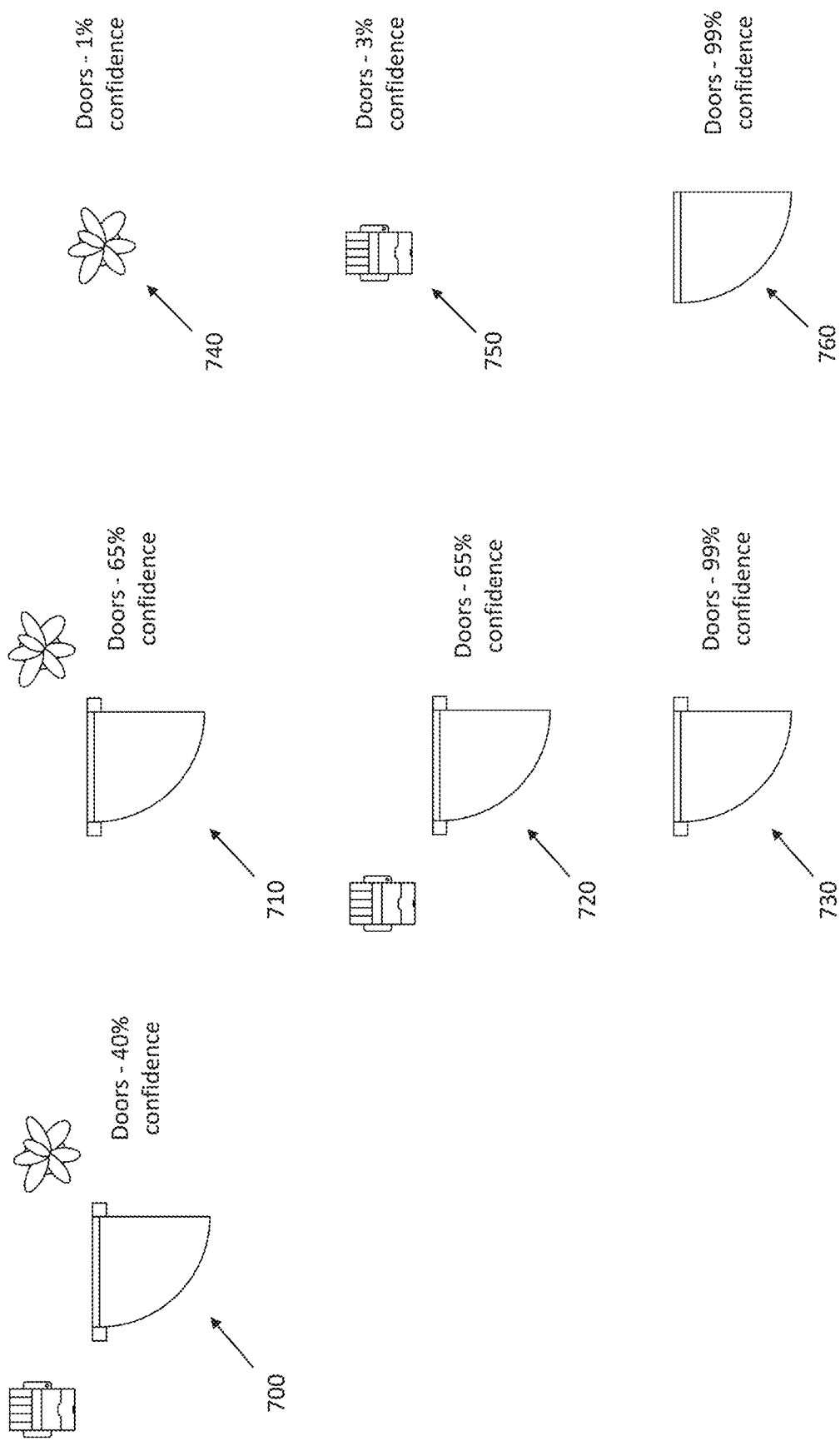
FIG. 7 illustrates an example of the different sublayers that may be derived from a source layer comprising multiple types of elements and the confidence with which each sublayer is mapped to an example type by a machine learning model.

To illustrate the process of applying an image classification model at S530 to a layer comprising multiple elements, reference is made to FIG. 7, which illustrates a layer 700 that is part of the floor plan data 315. This layer 700 comprises a number of different elements belonging to different types (i.e. a printer, a plant, and a door). An image classification model 700 may be applied to identify the extent to which the layer 700 matches the type 'door'. As shown in FIG. 7, the system 100 determines that the layer 700 matches the door type with 40% confidence. The system 100 then eliminates one of the elements (the printer) to obtain sublayer 710 and applies the image data representing sublayer 710 to the image classification model to determine that the sublayer 710 matches the door type with 65% confidence. The system 100 eliminates another one of the elements (the plant) from the layer 700 to obtain sublayer 720. The system 100 applies the image data representing sublayer 720 to the image classification model to determine that the sublayer 720 matches the door type with 65% confidence. The system 100 eliminates two of the elements (the plant and the printer) from the layer 700 to obtain a sublayer 730. The system 100 applies the image data representing the sublayer 730 to the image classification model and determines that the sublayer 730 matches the door type with 99% confidence. The system 100 eliminates two further ones of the elements (the door and the printer) from the layer 700 to obtain a sublayer 740. The system 100 then applies the image data representing sublayer 740 to the image classification model to determine that the sublayer 740 matches the door type with 1% confidence. The system 100 then eliminates two further ones of the elements (the door and the plant) from the layer 700 to obtain a sublayer 750. The system 100 then applies the image data representing sublayer 750 to the image classification model to determine that the sublayer 750 matches the door type with 3% confidence. The door shown in the layer 700 comprises two separate elements, i.e. an element representing the frame and a further element representing the door panel. The system 100, therefore, generates a sublayer 760 without the frame, but with the door panel. The system 100 applies the sublayer 760 to the image classification model to determine that the sublayer 760 matches the door type with 99% confidence. The two sublayers 730, 760 produce the best match to the door type. Since—of these two sublayers 730, 760—the sublayer 730 comprises the most elements, the system 100 outputs the sublayer 730 as one of the layers in the refined floor plan with an indication of the door (i.e. door) as the type for this layer. Similarly, the other elements (i.e. the plant and the printer) shown in the original source layer 700 may be separated into one or more further sublayers that are output as layers in the refined floor plan 325.

Prior to applying the one or more image classification models to classify the elements in a layer, each element in the layer may be delineated using object detection methods. For instance, each element may be detected by identifying a corresponding region within the layer which is likely to relate to an element using a corresponding object detection model. The object detection model may be configured to identify separate elements within a layer (e.g. regardless of their potential classification). This object detection model may be a separate model to the image classification model, which is configured to determine the likelihood that a set of elements relate to one or more classifications.

FIG. 7 illustrates an example in which an image classification model is used to provide an indication as to how well a particular layer maps to a type of element, in this case, doors. However, the system 100 may apply such a model to determine how well a particular layer maps to different types. For example, when supplying the layer 700 to an image classification model, the system 100 may determine that the layer 700 matches the doors type with 40% confidence, that it matches the plant type with 25% confidence, and that it matches the printer type with 25% confidence.

Referring back to FIG. 5, the system 100 determines a type for the layer that is subject to the process 500 by performing one or more of the steps S510, S520, S530. Although the process 500 includes different steps (i.e. S510, S520, S530) by which the system 100 determines a type, the system 100 does not need to perform all of these in order to determine a type, but may perform a subset of the steps S510, S520, and S530.

When performing multiple ones of the steps S510, S520, S530, the system 100 may determine the type for a particular layer in dependence upon a combination of the results of the steps S510, S520, S530. For example, the system 100 may (at S530) by applying an image of the layer to an image classification model, determine that there is a 75% probability that the layer is a doors layer. The system 100 may (at S520) further determine that the layer is associated with a name in the floor plan data 315 matching the doors type. In dependence upon the output of the image classification model and the analysis of the name, the system 100 may determine that the layer has a 95% probability of matching the doors type.

The system 100 may determine a probability associated with the type that is determined for the layer in one or more steps S510, S520, and S530. In particular, the output of the image classification model may indicate a particular type with a given level of certainty. The user interface 105 may display to the user, a request for confirmation that the determined type is correct. Such a request may include an indication of the determined probability, e.g. the request may state "the system evaluated that this is an internal walls layer with a 73% confidence, please confirm". At S540, the system 100 receives user input confirming the type for the layer identified on the display 105.

At S550, the system 100 updates the floor-plan data 315 to include the layer classification determined in the previous steps of the process 500.

At S560, the system 100 updates the mapping history stored in the memory 120, 125 and which may be used when performing S510 in relation to subsequent layers (which may belong to a different floor plan derived from a different floor plan file). For example, the system 100 may, using one of the image classification models, determine that layers derived from a first floor plan file each belong to an associated type. In response, the system 100 stores indications of the type for each of those layers. If, subsequently, a second floor plan file is processed at the system 100, where that second floor plan file is a later version of the first floor plan file, the indications stored by the system 100 may be used at S510 to categorize the layers received in the second floor plan file, if those layers have not been modified as compared to the first floor plan file.

Referring back to FIG. 3, it is shown that the output of the classification step S320 is the refined floor plan, which comprises layers and an indication of the type for each of the layers. Some or all of the layers in the refined floor plan may correspond to the layers in the source file 305, whereas some may be sublayers determined by splitting elements of different types found in a layer of the source file 305 into separate sublayers.

At S330, a process (which may be referred to as the polylining process) is performed in order to identify different spaces (i.e. rooms in the floor plan). This process is carried out on the basis of certain layers identified in S320. The selected layers comprise a group of the elements (e.g. walls and doors) that belong to one or more predetermined ones of the classifications. These layers and, hence the selected groups of elements, are selected in response to determining that the group of the elements belong to one or more predetermined ones of the classifications.

As noted, layers indicating the boundaries of the spaces may be used, e.g. one or more walls layers (i.e. internal walls and/or external walls) and one or more doors layers. Alternatively, one or more layers representing objects presented in the spaces may be used to identify the spaces based on the identification clusters of objects. The polylining process is performed automatically by the system 100 using the selected group of elements. Different automatic polylining strategies may be applied by the system 100. At the start of the process S330, the system 100 may select between one of these polylining strategies in order to identify the different spaces.

Figure 8:
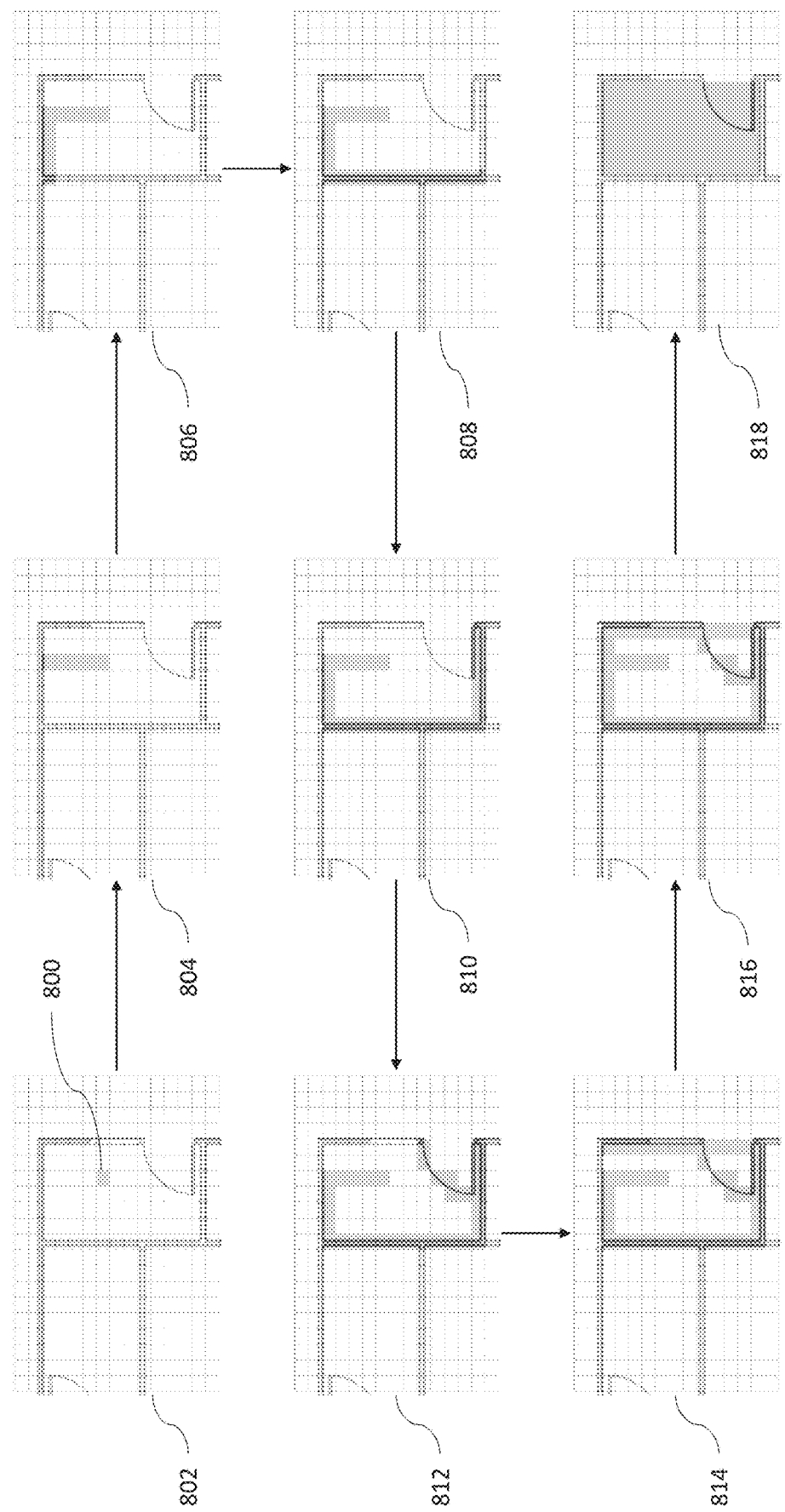
FIG. 8 illustrates an example of a process for performing polylining to identity a space within a floor plan.

One of the polylining strategies that may be used to perform S330 is edge following. Reference is made to FIG. 8, which illustrates an example of polylining for a space by performing edge following. FIG. 8 shows a set of images 802 to 818 in which are displayed layers comprising walls and doors, which form the boundaries of the spaces. Initially, as shown in image 802, a reference point 800 is selected in one of the spaces of the floor plan. The reference point 800 may be selected in a number of different ways. For example, the reference point 800 may be selected on the basis of an element (e.g. a string of text, an item of furniture) belonging to another layer that may be expected to be within a room. Alternatively, the reference point may be selected by selecting any particular point that falls within an enclosed space formed by the boundary elements.

As shown in FIG. 8, the system 100 selects a reference point 800 within a space in the image 802. From this reference point 800, the system 100 draws a line in one direction (upwards in this case) from the reference point 800 until it reaches a boundary of the space, i.e. a wall, as shown in image 804. As shown in image 806, the system 100 draws a line in a further direction (leftwards) until it reaches a further boundary. The system 100 continues to trace along the walls of the room as shown in images 808 and 810. As shown in image 812, when the door element is encountered, this element may be bypassed with the gap between the previous wall cell and the next one being bridged. In other words, the door is replaced with a straight line between the two portions of the wall.

As shown in images 814 and 816, the system 100 continues to trace along the wall boundaries until reaching the starting point where it stops. A closed boundary has now been drawn around the edge of the room. Image 818 shows this space filed.

An alternative process that the system 100 may employ to identify the spaces is a flood fill approach, whereby starting from a reference point within a space, the system 100 recursively explores the area until reaching the boundaries of the room space, as indicated by the wall and door layers.

The system 100 performs an automatic polylining process to identify and segment each of the spaces within the floor plan.

As mentioned, the reference points for each of the spaces may be created within each of the enclosed spaces in the floor plan. However, in some cases imperfections in the images derived from the floor plan file 305 may mean that there are gaps in the boundary elements, e.g. a gap in the wall, such that the system 100 could fail to identify all of the spaces within a floor plan. To address this problem, the system 100 may increase the thickness of the walls in the floor plan to eliminate gaps, so as to enable the reference points within each of the spaces to be identified.

Figure 13:
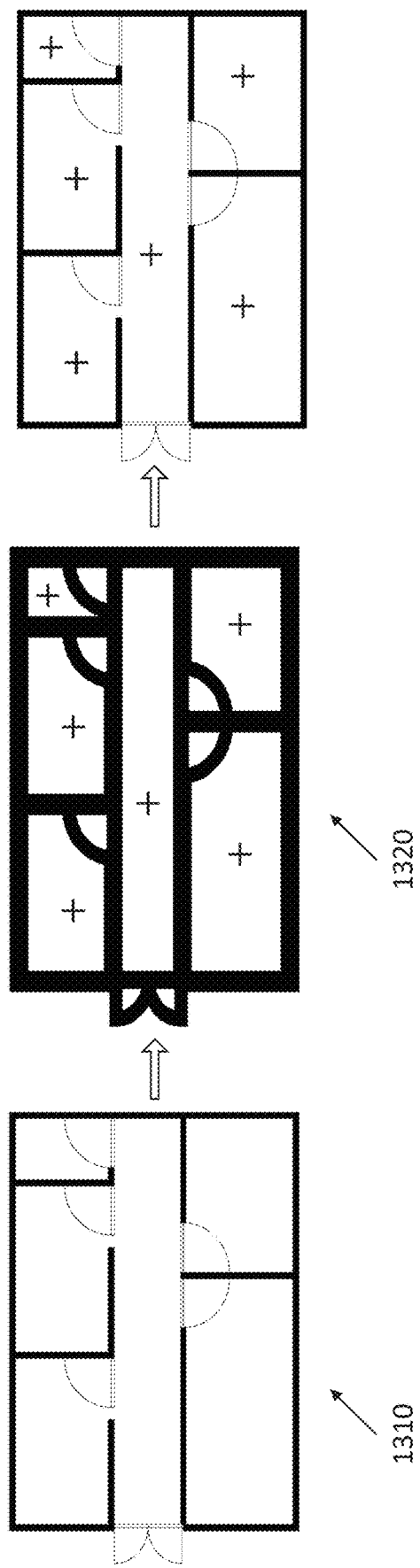
FIG. 13 illustrates a process for identifying enclosed spaces within a floor plan in which there are gaps in the walls.

Reference is made to FIG. 13, which shows an image 1310 representing a floor plan, the image 1310 is derived from the floor plan data 315 for a particular floor plan file 305. The image 1310 shown includes the walls and door layers of the floor plan. As shown, there are gaps in the walls of two of the rooms within the image 1310 of the floor plan. In the first image 1310, there are gaps in the walls of two of the rooms within the first image 1310, such that these rooms would not be identified as distinct enclosed spaces. Therefore, the system 100 enlarges the thickness of the walls to generate the image 1320, such that the two rooms then form distinct enclosed spaces. The system 100 then places reference points in each of the enclosed spaces as indicated. Using the original image 1310 with the reference points added on the basis of image 1320, the system 100 then performs the polylining (e.g. by tracing the edges of the rooms as shown in FIG. 8 or by recursively filing the room) to identify the spaces.

It has been described how the identification of different spaces in the floor plan may be performed in dependence upon the boundary elements belonging to the floor plan. However, alternatively, the polylining step S330 may be carried out based on identifying clusters of elements in the floor plan.

Figure 14:
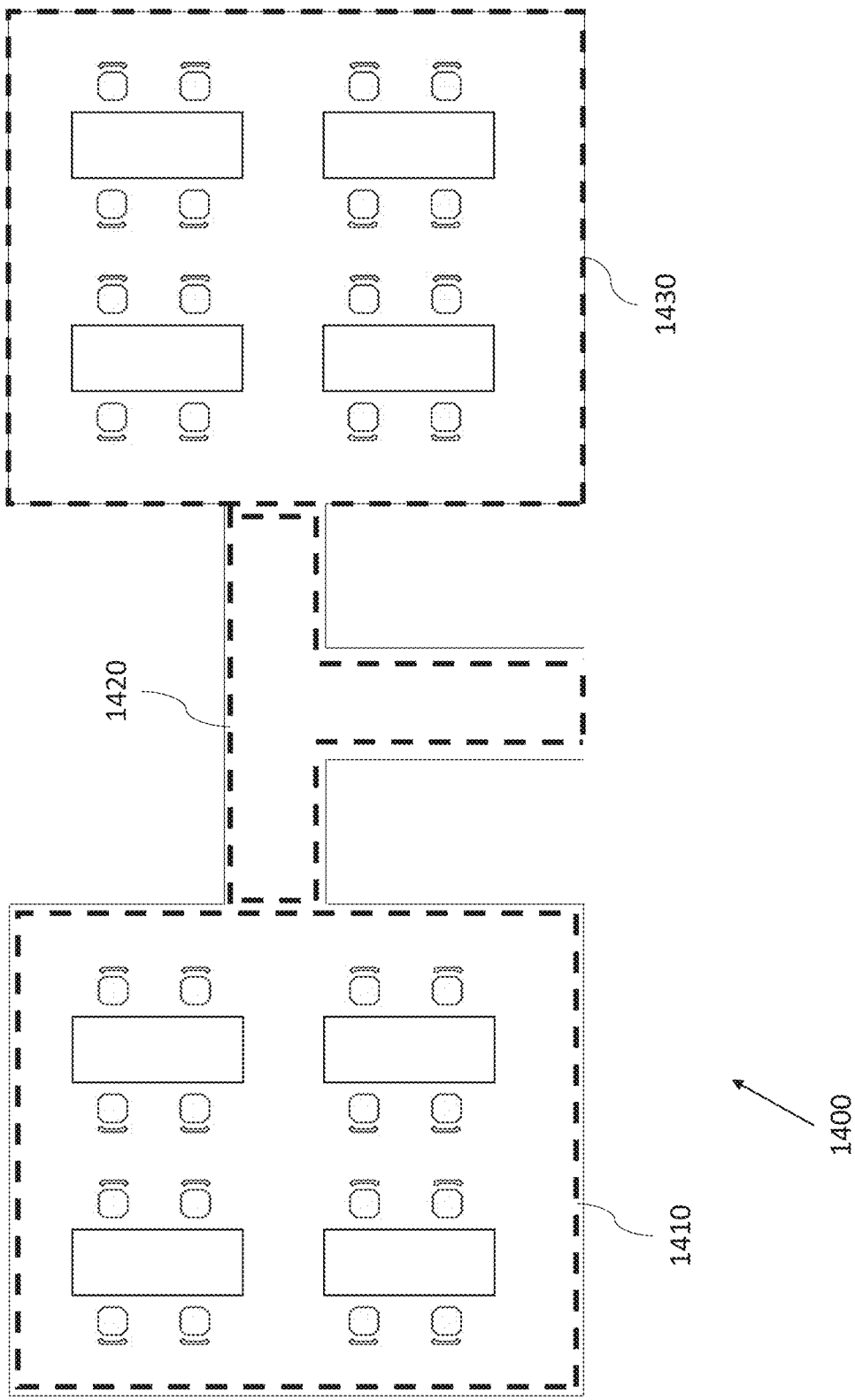
FIG. 14 illustrates how a floor plan may be segmented into different spaces based on identified clusters of elements in the spaces.

Reference is made to FIG. 14, which illustrates an example in which a group of elements belonging to the categories 'chairs' and 'tables' are used to segment the floor plan into three different spaces. FIG. 14 illustrates two open plan areas 1410, 1430, each of which comprises a number of chair elements and desk elements. The open plan areas 1410, 1430 are separated from one another by a corridor/circulation area 1420. Since there are no door elements separating the areas 1410, 1420, 1430 from one another, the system 100 uses the arrangement of the chair and desk elements to segment the floor plan 1400 into the different spaces. The system 100 identifies the area 1410 in response to detecting a first cluster of chair and desk elements within the area 1410, and identifies area 1430 in response to detecting a second cluster of chair and desk elements within the area 1430. The system 100 further identifies area 1420 as being an area without any chair and desk elements, i.e. an area in which there are no elements belonging to one of the identified clusters. The system 100 may identify the clusters 1410, 1430 by applying one or more machine learning models to input data specifying the locations of the chair and desk elements in the floor plan 1400 or by a rule-based approach by determining a boundary around a group of desk and chair elements if no further elements belonging to these types are found within a predetermined distance.

In FIG. 14, chair and desk elements are examples of types of element on the basis of which spaces 1410, 1420, 1430 may be identified based on clusters of those elements. However, the system 100 may select a different type of element and segment a floor plan into different spaces based on the identification of clusters of elements of that different type.

For some of the spaces in the floor plan, that space may be further segmented into a further set of spaces. The identification of the further spaces is performed as part of the polylining process in S330 and is performed by drawing boundaries around sets of one or more elements of a particular type. These further spaces may be referred to as subspaces or regions.

Figure 15:
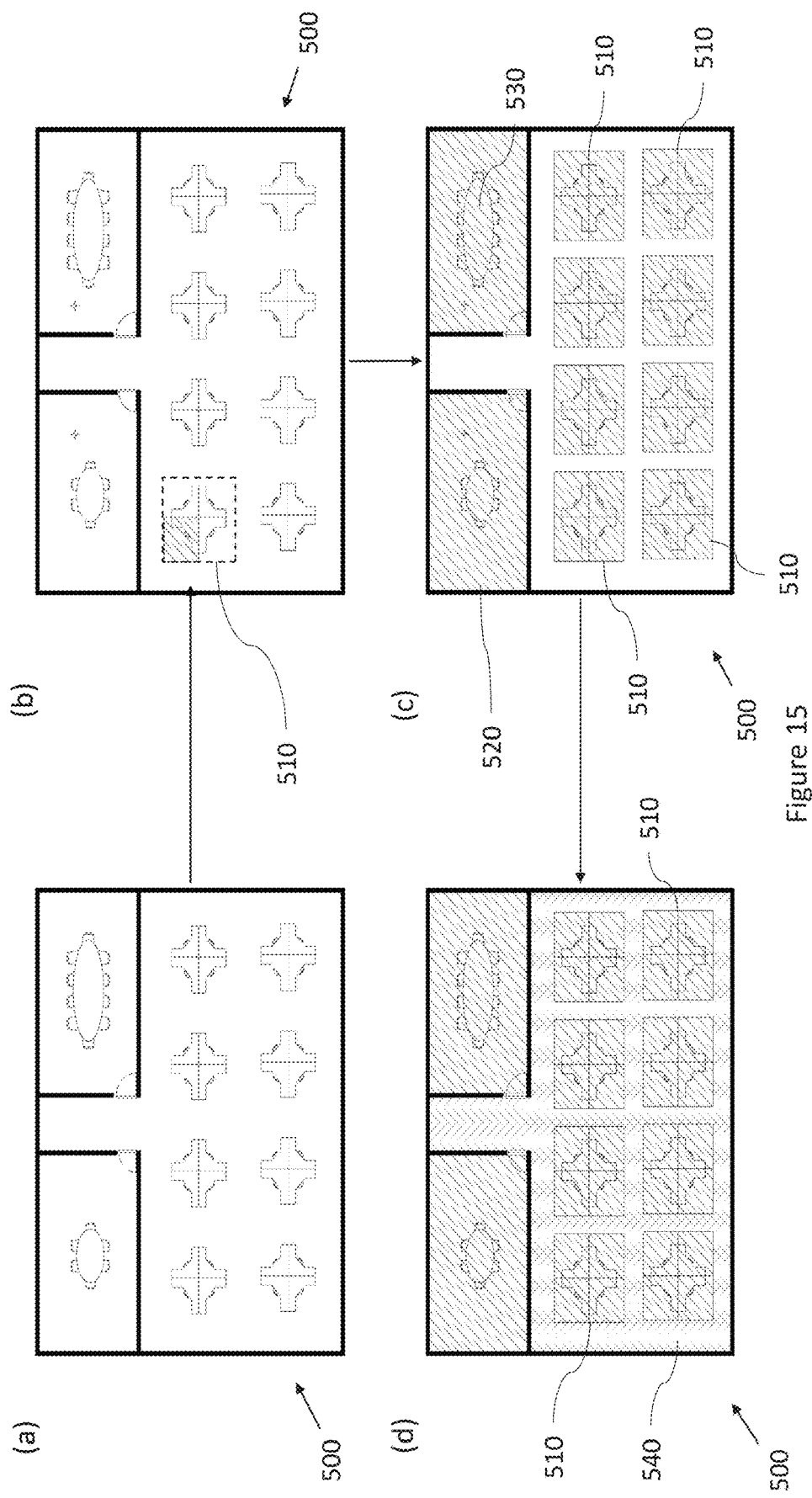
FIG. 15 illustrates how a space identified within a floor plan may be further segmented based on identified elements within the space.

Reference is made to FIG. 15, which illustrates a floor plan 500 having a number of rooms. The different representations of the floor plan shown in FIG. 15 represent different stages (labelled (a)-(d)) of the polylining process.

At stage (a) is shown an image of the floor plan 500 prior to performing the segmentation of the floor plan 500 into different spaces.

As shown at stage (b), a set of elements that may represent a region 510 within a space is identified in the floor plan 500. This set of elements may be identified by user input manually selecting the region 510 or the set of elements within the region 510. Alternatively, the set of elements may be identified by automated image processing performed by the system 100, e.g. by the system 100 applying one or more machine learning models or a rules based classification process in order to identify one or more sets of elements within the floor plan 500 that represent a distinct region 510. In the example given in FIG. 15, the identified region 510 is a workspace 510, and the set of elements within the workspace 510 includes a desk and chairs.

As shown at stage (c), the different spaces 520, 530 are identified within the floor plan 500. These spaces may be identified by applying the techniques described above (e.g. with respect to FIG. 8) for identifying spaces bounded by boundary elements (i.e. walls and doors). Also, as shown in FIG. 15, a number of different regions 510 are identified by detecting further occurrences of the sets of elements identified in stage (b). The system 100 identifies all occurrences of the same layout of elements and create the equivalent polylines (this takes into account rotation and mirroring). In the example given in FIG. 15, this amounts to identifying the further workspaces within the floor plan 500.

As shown at stage (d), the system 100 identifies a further region 540 within the floor plan 500. This further region 540 is identified by determining the area within the floor plan 500 that falls within the room containing the regions 510, where that area excludes the regions 510 themselves. As part of identifying the region 540, the system 100 identifies the space bounded by boundary elements (i.e. walls and doors) and containing the regions 510. The system 100 identifies the space by applying the techniques discussed above for performing identified of spaces based on boundary elements. The system 100 then identifies the region 540 as being the area within the identified space that excludes regions 510. In this example, where the regions 510 represent the workspaces, the region 540 represents a navigable space.

The identification of navigable spaces (e.g. space 540) and workspaces (e.g. workspace 510) may be applied to determine a path distance (e.g. a travel distance and/or travel time) across the navigable spaces. For instance, a path distance between two points in the floor plan may be determined, wherein the path follows a navigable path which avoids obstructions. The path may be selected from a variety of navigable paths, wherein the path has the shortest distance or travel time. For instance, the path can be used to determine travel time (e.g. for users of the environment represented by the floor plan). The travel time may be based on a predetermined speed (e.g. an average speed of a user). The travel time may include additional time added on for traversing certain sections of the floorplan (e.g. time for opening a door, climbing stairs, using an elevator, etc.). The additional time may be a predefined amount of time according to the type of section being traversed.

The identification of navigable spaces can be used to perform routing of users through the environment, to help optimize the design of the environment (e.g. to reduce or minimize chokepoints). Accordingly, the classified floorplan can be input into an optimization engine (e.g. a machine learning engine) which may move or adjust the size and/or shape of various spaces to optimize certain criteria (e.g. reduce travel time, remove chock points, distribute certain types of area (e.g. bathrooms) across the space, etc.).

The identification of navigable spaces and workspaces may be used to perform the assignment of personnel by the user device 200 to workspaces. For instance, the user device 200 may select workspaces in which to allocate personnel based on path distances between workspaces, where these path distances are calculated based upon paths through one or more identified navigable spaces. The user device 200 may allocate one or more members of staff to a particular workspace in the floor plan, and then select a further workspace (which may be in a different room) in the floor plan at which to place one or more further members of staff, where the selection of the further workspace is performed in dependence upon the path length through a navigable space between the workspace and the further workspace. For example, the user device 200 may select the further workspace in response to determining that the further workspace is associated with the minimum path length through the navigable space from the initial workspace. The calculation and use of path lengths in a floor plan is described in more detail in our earlier application U.S. application Ser. No. 17/941,234, which is incorporated by reference.

Referring again to FIG. 3, the identified spaces of the floor plan 335 are obtained as a result of the polylining process performed by the system 100. The system 100 then analyses each of these spaces at S340 and S345 in order to identify various attributes of each space. At S340, the space classification is performed to determine the type of space, e.g. meeting room, office, etc. The type of space may otherwise be referred to as the 'classification' for the space, or the 'category' for the space. The classification for the space may be understood to refer to the use or intended use of the space.

For some of the identified spaces, the classification could be carried out based on text data that is part of the floor plan data 315. For example, if the floor plan data 315 includes a text label within a particular space that reads 'conference room', the system 100 determines that the space is of the type 'conference room'.

For at least some of the spaces, the classification step S340 comprises using an image classification model to classify the space based on an image of the space. In this case, the system 100 provides images representing the space and extracted from the floor plan to one or more image classification models configured to identify the space. The one or more image classification models are further image classification models, which are different to the image classification models, e.g. model 615, used for the layer classification. These one or more image classification models may comprise a single image classification model configured to determine matches to spaces of a number of different types. Alternatively, the one or more image classification models may comprise a number of image classification models, each of which is configured to determine whether or not a space matches a particular type of space (or subset of types of space). The images of the spaces that are provided to the image classification model to perform the classification may comprise raster data or vector data.

To perform the spatial classification, additional layers (other than those indicating the boundaries of the space) are provided in an image. The additional layers may include one or more furniture layers. This image is then provided as an input to the relevant image classification model. The one or more image classification models (e.g. convolutional neural networks) used for spatial classification may comprise one or more machine learning models used for performing spatial classification of at least some of the spaces. Additionally, the one or more image classification models may comprise different types of model, e.g. models for classifying images based on edge detection according to programmed rules. A combination of different types of image classification model could be used. For example, convolutional neural network may be used for identifying a first type of room, whilst a programmed rules based model may be used for identifying a second type of room.

Figure 9:
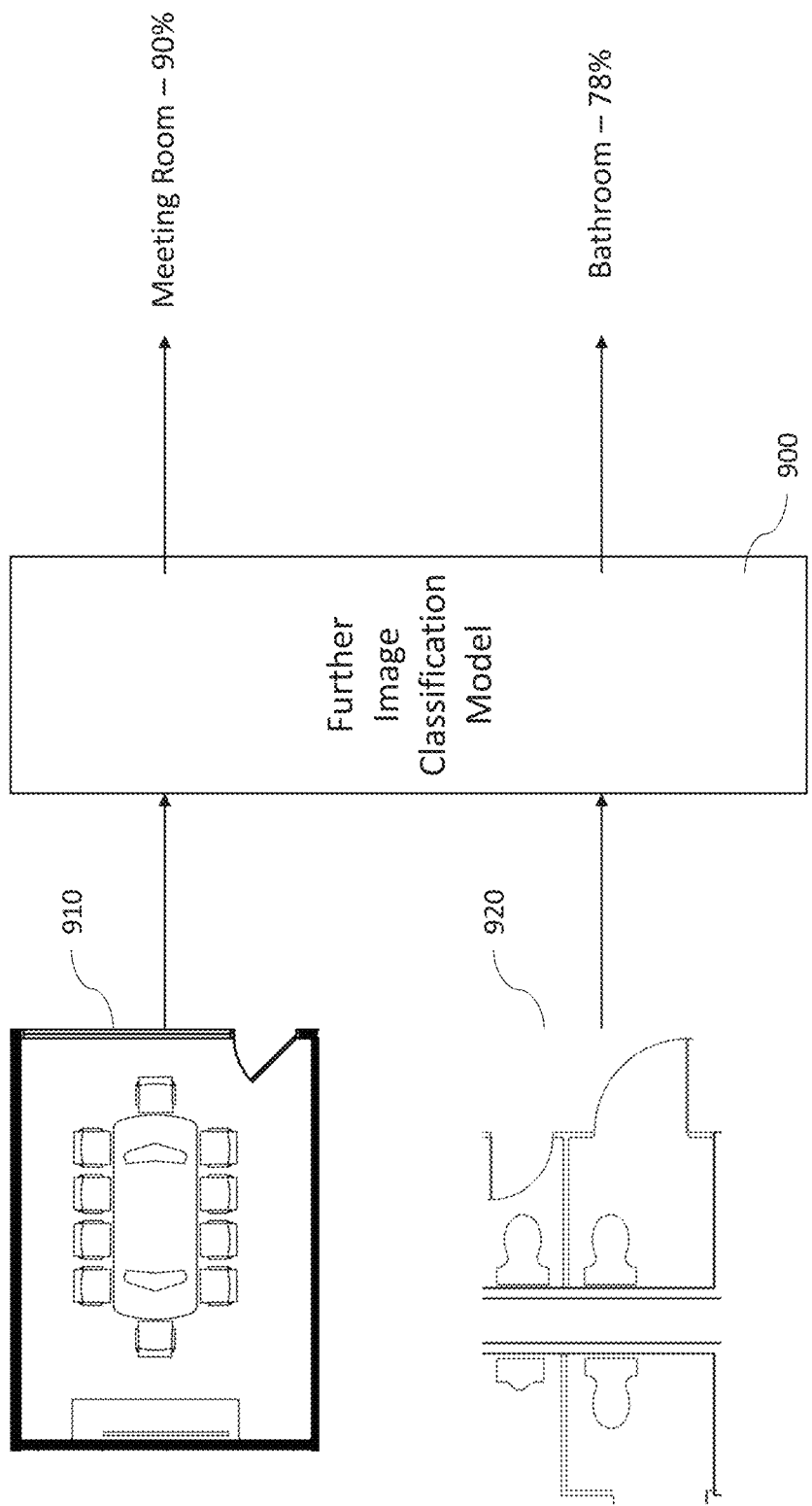
FIG. 9 illustrates an example of the use of an image classification model to perform identification of a meeting room and a bathroom.

Reference is made to FIG. 9, which illustrates the use of an image classification model 900 for performing the spatial classification. A first example image 910 is shown representing a space. The image 910 comprises a number of chair elements, and two table elements within the space. The first example image 910 is provided to the image classification model 900, which identifies the space as being a meeting room.

The second example image 920 is provided to the image classification model 900, which identifies the space as being a bathroom.

The model 900 may provide an output indicating the probability that the space is of the type indicated. For example, when the system 100 provides the image 910 as an input to the model 900, the output of that model 900 indicates that there is a 90% probability that the space represented in the image 910 is a meeting room. When the system 100 provides the image 920 as an input to the model 900, the output of that model 900 indicates that there is a 78% probability that the space represented in the image 920 is a bathroom. The system 100 may display on the user interface 105, a request for the user to confirm that the space represents the type of space indicated by the model 900. For example, the interface 105 may display the message "the system evaluated that this is a meeting room with a 90% confidence, please confirm". In response to user input confirming that the inference from the model 900 is correct, the system 100 stores the determined type as being the classification for the relevant space. Alternatively, or in addition, the system 100 may select a particular classification for the space based on the probability (e.g. selecting the classification having the highest probability or selecting a classification that has a probability exceeding a corresponding threshold).

Referring back to FIG. 3, having determined the types for each of the spaces in the floor plan, the system 100 stores these types as part of the attributes associated with each space.

At S345, the system 100 determines further attributes associated with each of the spaces identified at S330 as being part of the floor plan. These further attributes include one or more of the surface area, the seating capacity and the number of entrance/exit points. The surface area may be determined by the system 100 in a rules based manner by examining the size of the space in the floor plan. The capacity may be determined by the system 100 counting the number of chairs within the space. The number of access points may be determined by the system 100 counting the number of doors within the space.

As discussed above, the image classifications used for the layer classification and space classification may be machine learning models. Such machine learning models may comprise neural networks (e.g. convolutional neural networks). Neural networks (e.g. artificial neural networks) comprise arrangements of sets of nodes which are interconnected by links and which interact with each other. The links may also be referred to as edges. The network can take input data and certain nodes perform operations on the data. The result of these operations is passed to other nodes. The output of each node is referred to as its activation or node value. Each link is associated with a weight. A weight defines the connectivity between nodes of the neural network. Different techniques are known by which neural networks are capable of being trained, which takes place by altering values of the weights.

Figure 10:
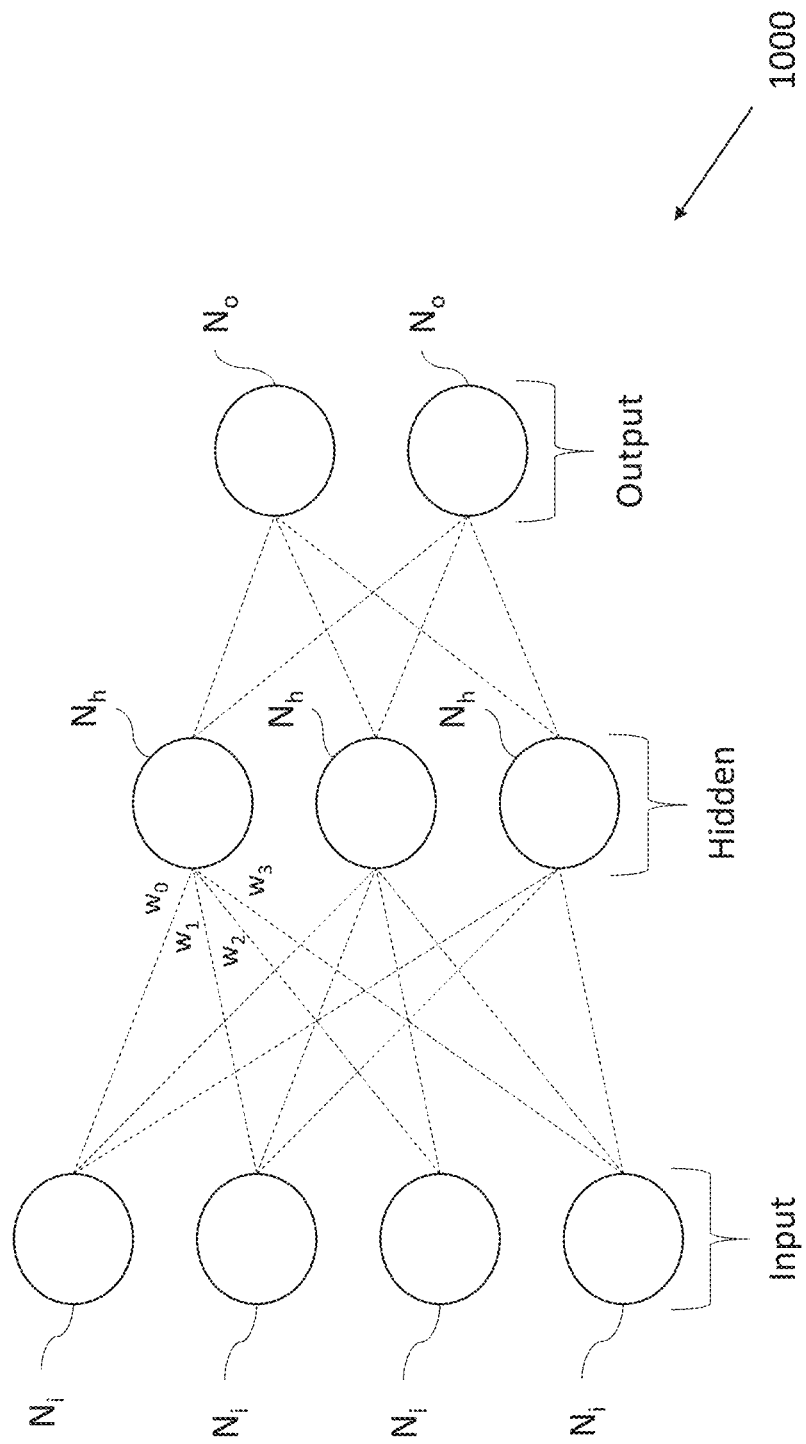
FIG. 10 illustrates a simplified example of a neural network.

FIG. 10 shows a simplified version of a neural network 1000. The neural network 1000 comprises an input layer of nodes, a hidden layer of nodes and an output layer of nodes. In practice, there are likely to be many more nodes than those shown, and more hidden layers than the one shown. Each node of the input layer Ni receives a single value of the input data and produces at its output an activation or node value, which is generated by carrying out an activation function (e.g. a sigmoid) on its input value. Each node Ni in the input layer is connected to each node $N_h$ in the hidden layer. A vector of node values from the input layer is scaled by a vector of respective weights at the input of each node in the hidden layer, each weight defining the connectivity of that particular node with its connected node in the hidden layer. The weights applied at the inputs of one of the nodes $N_h$ are shown in FIG. 10 as $w_0 \ldots w_3$. At each node $N_h$ in the hidden layer, the input value at that node is given by the dot product of the weights vector connecting it to the input layer and the output values of the input nodes. The activation function is then applied to the input values at the nodes $N_h$ to provide the output values of those nodes. The output vector of the hidden layer is supplied to each of the nodes in the next layer of the network (i.e. the nodes $N_O$ of the output layer $N_O$ in this case) and used in a similar manner to generate the output values for that next layer.

The network 1000 may be trained through a variety of different methods, such as supervised or unsupervised learning. In one embodiment, the network 1000 is trained through supervised leaning by determining at least one set of output values, comparing the output values to known labels representing ground truth values, and calculating an error or loss associated with the network 1000 (e.g. based on a difference between the output values and the ground truth values). The loss is then back-propagated through the network 1000 to update the weights, such that the network 1000 is adapted to better approximate the labels from the input values. The update may optimize the weights according to an objective function (e.g. adjust the weights to reduce an error in the output values). In the next cycle, the updated weights are used with further training data to further revise the weights. In this way, the network can be trained to perform its desired operation.

When performing image classification, a convolutional neural network may be used. Convolutional neural networks are neural networks that make use of a convolution calculation in at least one of their layers. Convolutional neural networks are particularly well adapted to image analysis and processing as they are shift invariant.

Figure 11A:
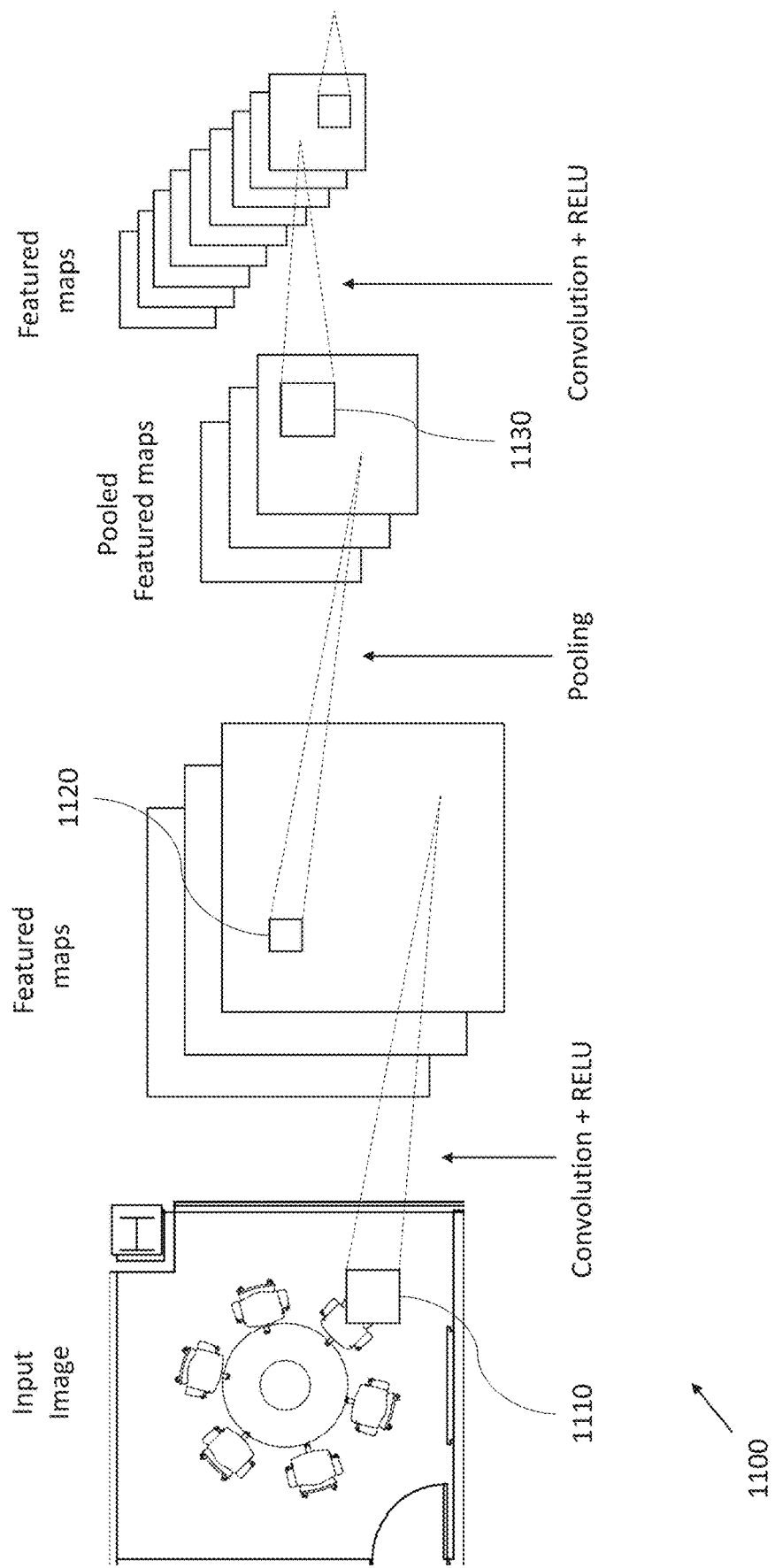
FIG. 11A illustrates a first part of an example convolutional neural network for classifying spaces.
Figure 11B:
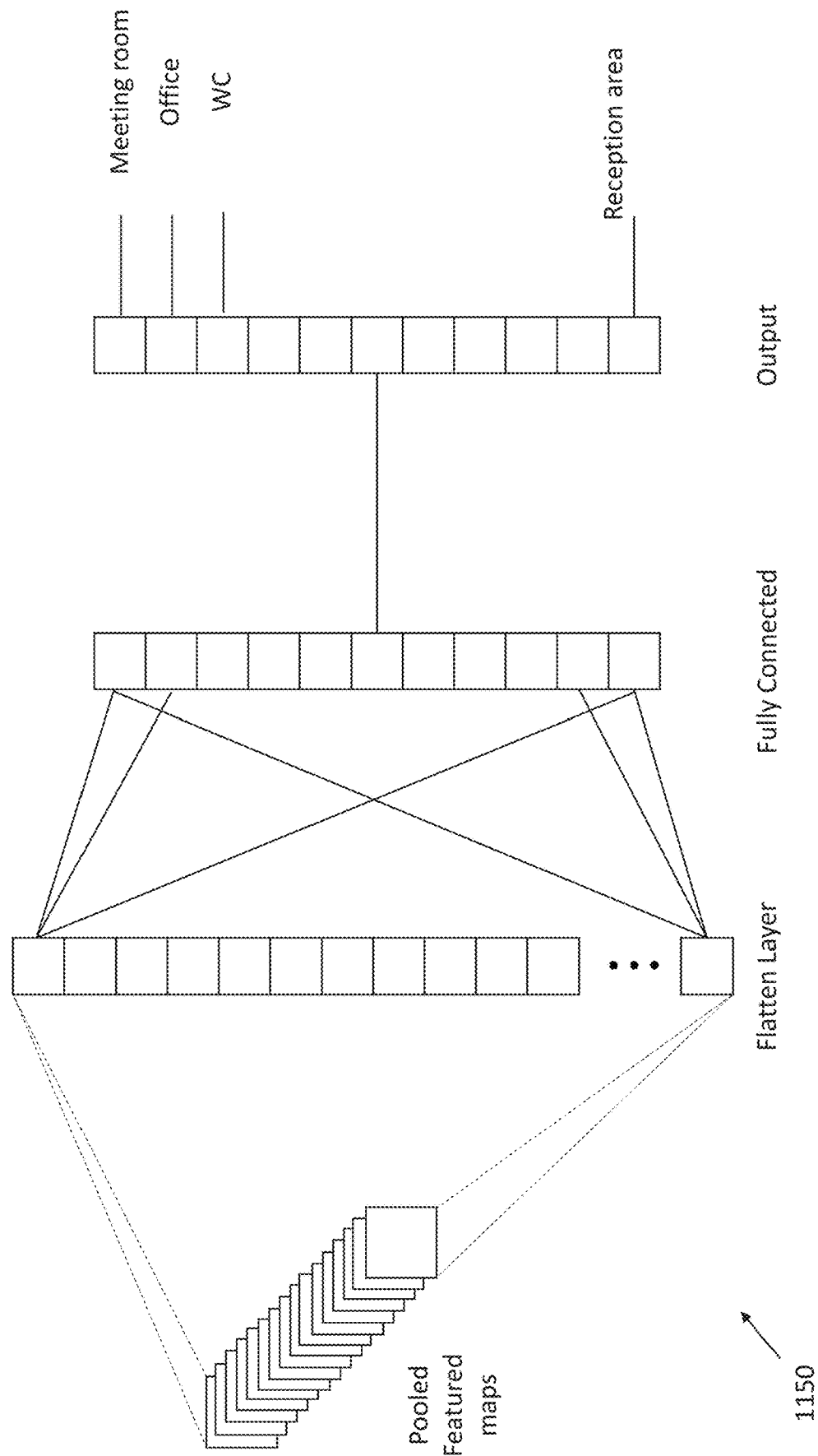
FIG. 11B illustrates a second part of an example convolutional neural network for classifying spaces.

Reference is made to FIGS. 11A and 11B, which illustrate an example of the operation of a convolutional neural network, which can be used to identify certain features within images and perform classification of those images. In the example shown, the input image is an image of a meeting room, with the convolutional neural network being used to classify the input image as meeting room.

A kernel 1110 is applied to determine a convolution of the input image with the kernel 1110. The output of this convolution is subject to an activation function to add non-linearly. The activation function used in FIG. 11A is a rectified linear activation unit (RELU), which outputs the input if the input is positive, but outputs zero if the input is not positive. A number of feature maps are generated from the input image in this way, by performing convolutions between the input image and different kernels, each of which represents a different type of basic feature, e.g. vertical line, horizontal line.

Each of the feature maps produced by the convolution and activation function is then subject to a pooling process, which is performed to reduce the spatial size of the convolved feature. The pooling process involves translating a kernel across the feature map to sample groups of pixels and returning the maximum or average value from each of the sampled pixels in the feature map. The resulting pooled feature maps are each subject to a further convolutions process (with the RELU function applied) using a respective kernel to generate a further set of feature maps from which pooling is again performed.

As shown in FIG. 11B, the pooled feature maps resulting from multiple stages of convolution and pooling are used to produce a one dimensional array, which is provided as an input to feed forward neural network. The resulting output values represent different types of space. The convolutional neural network may be trained by comparing these output values to labels and adjusting the weights of the feed forward portion of the convolutional neural network.

The training processes performed to train the machine learning models used for layer classification and space classification may be performed by the system 200. These training processes make use of sets of training data. For example, the training data for training the one or more models for performing space classification comprise images of the spaces and labels. The training data for training the one or more models for performing layer classification comprise images of layers and appropriate labels.

Figure 12:
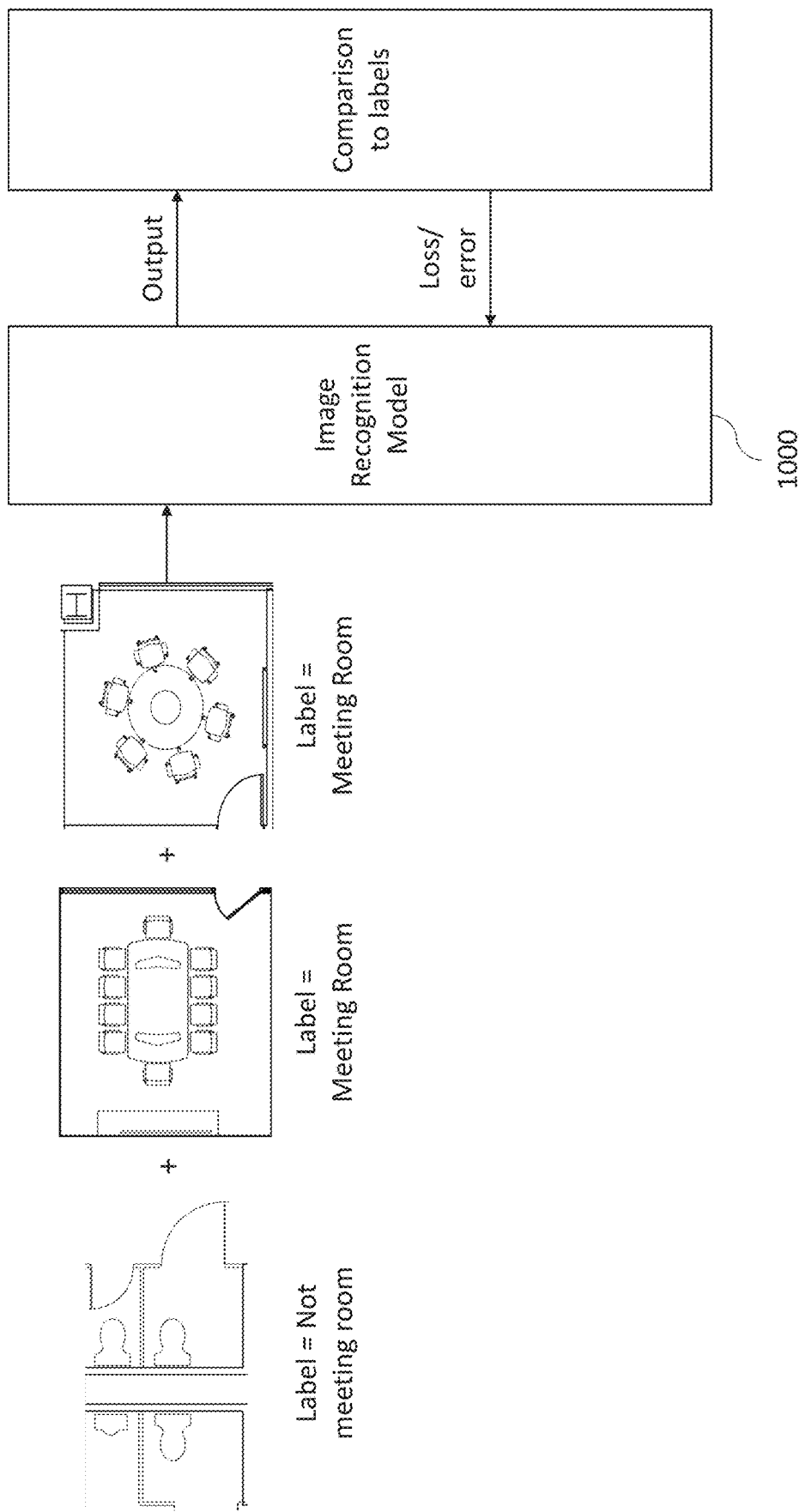
FIG. 12 illustrates a process for training a machine learning model to classify images of meeting rooms.

Reference is made to FIG. 12, which illustrates how a machine learning model 1000, which may be one of the models used for performing the space classification, may be trained. In this example, the machine learning model 1000 is a model for identifying meeting rooms. To train the model 1000, the system 200 provides the images as inputs to the model 1000 to obtain an output indicating whether or not the model 1000 identifies each of the images as being a meeting room. The system 200 compares the outputs for each of the images to the labels for each of the rooms to determine an associated loss/error for each of the images. The system 200 uses this loss to perform back-propagation of errors through the model 1000 to update the parameters of the machine learning model 1000.

In a similar way, the one or more models (e.g. model 615) for performing the layer identification are also trained. The types of features on which the layer identification model/s could be trained on may include doors, exterior walls, internal walls, elevator shafts, stairs, chairs, desks, and toilets.

As well as being trained on sets of human labelled data prior to being used for inference by the system 100, the machine learning models used for classification of either spaces or layers may be updated in response to new derived by the system 100. For example, the system 100 may process floor plan files 305 using process 300, as a part of which it provides a classification of layers within those files 305. As part of the layer classification process 500, the user provides confirmation (at S540) of the layer type suggested by the system (on the basis of steps S510, S520, S530). The user confirmation is used as a label for a further set of training data, the further set of training data comprising the images representing the layers derived from the floor plan file 305. The further set of training data is sent from the system 100 to the system 200, where the system 200 performs one or more training iterations to update the model used for layer classification using the further training data.

Similarly, the machine learning model/s used to perform space classification may be updated using further training data including labels derived from user input at system 100. As part of the space classification process S340, the user provides confirmation of the space type suggested by the system.

The user confirmation is used as a label for a further set of training data, the further set of training data comprising the images representing the spaces derived from the floor plan file 305. The further set of training data is sent from the system 100 to the system 200, where the system 200 performs one or more training iterations to update the model used for space classification using this further training data.

In addition or alternatively, the user confirmation may be used as a reward signal for use in reinforcement learning. In this case, the machine learning model may be trained to maximize a reward based on user feedback.

The data determined by applying the process 300 to one or more floor plans may be used to provide an application (such as a space management application) for running on a system 100. The application may provide for a portfolio inventory, e.g. by providing count of the number of a particular type of elements or spaces within a floor plan, where this count is derived based on the layer and space classification information. For example, the system 100 may derive a count for a particular type of element by determining the number of elements with a particular layer that has been determined to be associated with that type. The application may provide capacity planning, where the capacity is determined based on the surface areas of certain types of spaces identified in the floor plan. The application may enable personal assignment based on the identified room types and capacity within a floor plan. In this case, the system 100 may send information regarding the personal assignment to other devices (e.g. user devices of the personnel). Similarly, the application may provide for resource (e.g. room) reservations and booking to be performed by a user. The application may provide analysis based on determined room types and dimensions to provide space utilization improvements, and health and safety planning. The application may provide for the creation of maps based on the floor plans.

The system 100 may perform control of one or more physical systems on the basis of determined space classification. For example, the system 100 may control a lighting system for a room in dependence upon the classification for that room. For example, the system 100 may control the level of lighting in dependence upon the classification or control the timing of activation of lighting in the room. Additionally or alternatively, the system 100 may control a heating system, so as to control the temperature within a room in dependence upon the classification for that room. Additionally or alternatively, the system 100 may control a fire system (e.g. a fire alarm, or sprinklers) of the room in dependence upon a room classification. The system 100 may output a control signal to a further apparatus to provide control any or all of these.

Whilst certain embodiments are described in the context of analyzing a floorplan of a building, the application is not limited to internal spaces. Accordingly, the methods described herein may be equally applied to processing floorplans detailing any form of space or environment, such as external spaces or areas, and need not be limited to floorplans of buildings.

Implementations of the subject matter and the operations described in this specification can be realized in digital electronic circuitry, or in computer software, firmware, or hardware, including the structures disclosed in this specification and their structural equivalents, or in combinations of one or more of them. For instance, hardware may include processors, microprocessors, electronic circuitry, electronic components, integrated circuits, etc. Implementations of the subject matter described in this specification can be realized using one or more computer programs, i.e., one or more modules of computer program instructions, encoded on computer storage medium for execution by, or to control the operation of, data processing apparatus. Alternatively or in addition, the program instructions can be encoded on an artificially generated propagated signal, e.g., a machine-generated electrical, optical, or electromagnetic signal that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

While certain arrangements have been described, the arrangements have been presented byway of example only, and are not intended to limit the scope of protection. The inventive concepts described herein may be implemented in a variety of other forms. In addition, various omissions, substitutions and changes to the specific implementations described herein may be made without departing from the scope of protection defined in the following claims.

The invention claimed is:

1. A computer system comprising at least one processor and at least one memory comprising computer readable instructions, the at least one processor being configured to execute the instructions to perform the steps of:

for each of a plurality of elements in a floor plan, determining from data representing the floor plan, one of a number of classifications for the respective element;

selecting a group of the elements in response to determining that the group of the elements belong to one or more predetermined ones of the classifications;

subsequently, based on the selection of the group of the elements, segmenting the floor plan into a number of different spaces using the group of the elements; and for each of at least some of the different spaces, providing image data representing the respective space and extracted from the floor plan as an input to an image classification model to obtain a classification for the respective space.

2. A computer system as claimed in claim 1, wherein for each of the at least some of the different spaces, the image classification model comprises a machine learning model configured to process the image data representing the respective space to obtain the classification for the respective space.

3. A computer system as claimed in claim 1, wherein the one or more predetermined ones of the classifications comprises one or more types of element representing boundaries between the different spaces, wherein the group of the elements comprises the elements representing the boundaries between the different spaces in the floor plan.

4. A computer system as claimed in claim 3, wherein the elements representing the boundaries between the number of different spaces comprise wall elements.

5. A computer system as claimed in claim 4, wherein the elements representing the boundaries between the number of different spaces further comprise door elements.

6. A computer system as claimed in claim 3, wherein the step of segmenting the floor plan into a number of different spaces comprises, for each of the different spaces:
determining a point falling within an enclosed space formed by ones of the boundaries associated with the respective space; and
starting from the respective point, tracing a path along the ones of the boundaries associated with the respective space.

7. A computer system as claimed in claim 3, wherein the step of segmenting the floor plan into a number of different spaces comprises, for each of the different spaces:
determining a point falling within an enclosed space formed by ones of the boundaries associated with the respective space; and
recursively exploring the respective space starting from the respective point until reaching the ones of the boundaries associated with the respective space.

8. A computer system as claimed in claim 1, wherein the step of determining for each of the plurality of elements in a floor plan, the respective one of the number of classifications, comprises applying the data representing the floor plan to one or more further image classification models operable to classify the elements.

9. A computer system as claimed in claim 8, wherein the data representing the floor plan comprises multiple layers, each of which comprises one or more elements, wherein the determining the classifications for each of the elements comprises:
for each of the layers, providing an image representing the respective layer to one or more further image classification models to determine, a respective classification for the elements of that layer.

10. A computer system as claimed in claim 9, wherein at least one of the multiple layers comprises elements belonging to different classifications, wherein the at least one processor is configured to execute the instructions to perform the steps of:
updating the data representing a floor plan to split the elements belonging to different classifications between different layers.

11. A computer system as claimed in claim 9, wherein:
for at least one of the multiple layers, a respective classification for the elements of that layer is a seating type; and
the steps further comprise determining seating capacity of at least one of the spaces of the floor plan by counting a number of elements of the seating type within the at least one of the multiple layers.

12. A computer system as claimed in claim 1, wherein the determining the classification for at least some of the elements is performed in dependence upon a name of a layer derived from a source file comprising the floor plan.

13. A computer system as claimed in claim 1, wherein the one or more predetermined ones of the classifications comprises one or more types of element representing objects within the spaces, wherein the step of, based on the group of the elements, segmenting the floor plan into a number of different spaces comprises identifying a number of clusters within the group of the elements in the floor plan.

14. A computer system as claimed in claim 1, wherein the at least one processor is configured to execute the instructions to perform the steps of:
deriving the data representing a floor plan from a source file providing according to a first format.

15. A computer system as claimed in claim 14, wherein the first format is a computer aided design format.

16. A computer system as claimed in claim 14, wherein, for at least some of the elements, the determining the respective classification is performed in dependence upon information determined for an earlier version of the source file.

17. A computer system as claimed in claim 16, wherein the at least one processor is configured to execute the instructions to:
derive further data representing a further floor plan from a further source file, the further source file being provided according to a second format; and
the data representing the floor plan and the further data representing the further floor plan are each provided according to a standard representation.

18. A computer system as claimed in claim 1, wherein the at least one processor is configured to execute the instructions to perform the steps of, for each of the different spaces:
deriving from the image classification model, a prediction of the classification for the respective space; and
determining the classification for the respective space in dependence upon user input confirming the prediction.

19. A computer system as claimed in claim 18, wherein the image classification model is a machine learning model, wherein the at least one processor is configured to execute the instructions to perform the steps of:
providing training data comprising:
the image data; and
a set of labels for the image data derived from the user input; and
performing one or more training iterations based on the training data to update the machine learning model to improve the accuracy of classifications produced by the machine learning model.

20. A computer system as claimed in claim 1, wherein the at least one processor is configured to execute the instructions to perform one or both of the following steps:
- for each of one or more of the different spaces, determining an area of the respective space in the floor plan based on a size of those spaces in the floor plan; and
- for each of one or more of the different classifications, determining an area of any spaces classified according to the classification in the floor plan based on the size of those spaces in the floor plan.

21. A computer system as claimed in claim 1, wherein the at least one processor is configured to execute the instructions to:
- provide a space management application, including controlling an interface of the computer system to display the determined classifications for each of at least some of the different spaces.

22. A computer system as claimed in claim 1, wherein the at least one processor is configured to execute the instructions to, for at least one of the spaces:
- in dependence upon the determined classification for the respective space, output a control signal to control one or more of:
  - a temperature of the space;
  - a lighting level within the space;
  - a timing of activation of lighting within the space; and
  - a fire system within the space.

23. A computer system as claimed in claim 1, wherein the step of extracting from the floor plan based on the identified boundaries, image data representing each of the number of different spaces comprises:
- increasing the thickness of the identified boundaries;
- identifying each of the number of different spaces by:
  - placing a respective reference point within each enclosed space in the floor plan; and
  - exploring the enclosed space starting from the reference point.

24. A computer system as claimed in claim 1, wherein for each of the at least some of the different spaces, the respective image data comprises vector data.

25. A computer system as claimed in claim 1, wherein for a first of the different spaces, the at least one processor is configured to execute the instructions to perform the steps of:
- identifying a plurality of regions within the first of the different spaces by identifying a number of sets within the first of the different spaces, each of the sets comprising elements of a predefined type.

26. A computer system as claimed in claim 1, wherein the classification for the respective space selects a classification from a set of classifications including one or more of:
- meeting space;
- office space;
- reception area;
- bathroom;
- kitchen;
- circulation area;
- workspace; and
- navigable space.

27. A computer system as claimed in claim 26, wherein a first of the at least some of the different spaces comprises a navigable space, wherein the at least one processor is configured to execute the instructions to perform the steps of:
- determining a path distance between two different points within the navigable space.

28. A computer implemented method for classifying a number of different spaces of a floor plan, the method comprising:
- for each of a plurality of elements in the floor plan, determining from data representing the floor plan, one of a number of classifications for the respective element;
- selecting a group of the elements in response to determining that the group of the elements belong to one or more predetermined ones of the classifications;
- subsequently, based on the selection of the group of the elements, segmenting the floor plan into a number of different spaces using the group of the elements; and
- for each of at least some of the different spaces, providing image data representing the respective space and extracted from the floor plan as an input to an image classification model to obtain a classification for the respective space.

29. A non-transitory computer readable medium storing a set of instructions, which when executed by at least one processor causes a method to be performed, the method comprising:
- for each of a plurality of elements in the floor plan, determining from data representing the floor plan, one of a number of classifications for the respective element;
- selecting a group of the elements in response to determining that the group of the elements belong to one or more predetermined ones of the classifications;
- subsequently, based on the selection of the group of the elements, segmenting the floor plan into a number of different spaces using the group of the elements; and
- for each of at least some of the different spaces, providing image data representing the respective space and extracted from the floor plan as an input to an image classification model to obtain a classification for the respective space.

* * * * *